(12) United States Patent
Park et al.

(10) Patent No.: US 9,799,764 B2
(45) Date of Patent: Oct. 24, 2017

(54) LATERAL POWER INTEGRATED DEVICES HAVING LOW ON-RESISTANCE

(71) Applicant: SK hynix Inc., Gyeonggi-do (KR)

(72) Inventors: Joo Won Park, Chungcheongbuk-do (KR); Kwang Sik Ko, Chungcheongbuk-do (KR); Sang Hyun Lee, Gyeonggi-do (KR)

(73) Assignee: SK HYNIX SYSTEM IC INC., Chungcheongbuk-Do (KR)

( * ) Notice: Subject to any disclaimer, the term of this patent is extended or adjusted under 35 U.S.C. 154(b) by 0 days.

(21) Appl. No.: 15/173,301

(22) Filed: Jun. 3, 2016

(65) Prior Publication Data

US 2017/0194489 A1    Jul. 6, 2017

(30) Foreign Application Priority Data

Dec. 31, 2015    (KR) .......................... 10-2015-0191107
Dec. 31, 2015    (KR) .......................... 10-2015-0191115

(51) Int. Cl.
| | |
|---|---|
| *H01L 29/78* | (2006.01) |
| *H01L 29/08* | (2006.01) |
| *H01L 29/10* | (2006.01) |
| *H01L 29/40* | (2006.01) |
| *H01L 29/06* | (2006.01) |

(52) U.S. Cl.
CPC ...... *H01L 29/7823* (2013.01); *H01L 29/0692* (2013.01); *H01L 29/0865* (2013.01); *H01L 29/0869* (2013.01); *H01L 29/0882* (2013.01); *H01L 29/0886* (2013.01); *H01L 29/1033* (2013.01); *H01L 29/1095* (2013.01); *H01L 29/404* (2013.01); *H01L 29/405* (2013.01); *H01L 29/407* (2013.01)

(58) Field of Classification Search
CPC ... H01L 29/78; H01L 29/1095; H01L 29/404; H01L 29/0692; H01L 29/0865; H01L 29/7823; H01L 29/0869; H01L 29/0882; H01L 29/0886; H01L 29/1033; H01L 29/405; H01L 29/407
See application file for complete search history.

(56) References Cited

U.S. PATENT DOCUMENTS

| | | | | |
|---|---|---|---|---|
| 7,671,408 | B2 * | 3/2010 | Denison | ................ H01L 29/407 257/330 |
| 9,520,493 | B1 * | 12/2016 | Kim | .................... H01L 29/7835 |
| 2002/0175351 | A1 * | 11/2002 | Baliga | ................. H01L 29/0878 257/242 |

(Continued)

*Primary Examiner* — Fazli Erdem
(74) *Attorney, Agent, or Firm* — IP & T Group LLP

(57) ABSTRACT

A lateral power integrated device includes a source region and a drain region disposed in a semiconductor layer and spaced apart from each other in a first direction, a drift region disposed in the semiconductor layer and surrounding the drain region, a channel region arranged between the source region and the drift region in the first direction, a plurality of planar insulation field plates disposed over the drift region and spaced apart from each other in a second direction, a plurality of trench insulation field plates disposed in the drift region, a gate insulation layer formed over the channel region, and a gate electrode formed over the gate insulation layer. Each of the trench insulation field plates is disposed between the planar insulation field plates in the second direction.

19 Claims, 20 Drawing Sheets

(56) References Cited

U.S. PATENT DOCUMENTS

| | | | |
|---|---|---|---|
| 2002/0177277 A1* | 11/2002 | Baliga | H01L 29/0878 438/268 |
| 2009/0256212 A1* | 10/2009 | Denison | H01L 29/0653 257/408 |
| 2010/0052091 A1* | 3/2010 | Tanaka | H01L 21/76202 257/501 |
| 2011/0147844 A1 | 6/2011 | Smith | |
| 2012/0223361 A1 | 9/2012 | Huang et al. | |
| 2013/0187226 A1* | 7/2013 | Park | H01L 29/402 257/343 |
| 2015/0325693 A1* | 11/2015 | Mori | H01L 29/0847 257/339 |
| 2016/0240658 A1* | 8/2016 | Kim | H01L 29/402 |
| 2016/0240662 A1* | 8/2016 | Park | H01L 29/4238 |
| 2016/0351707 A1* | 12/2016 | Kim | H01L 29/402 |

* cited by examiner

LATERAL POWER INTEGRATED DEVICES HAVING LOW ON-RESISTANCE

CROSS-REFERENCE TO RELATED APPLICATIONS

The present application claims priority under 35 U.S.C 119(a) to Korean Patent Application No. 10-2015-0191107 filed on Dec. 31, 2015 and Korean Patent Application No. 10-2015-0191115 filed on Dec. 31, 2015, which are herein incorporated by reference in their entirety.

BACKGROUND

1. Technical Field

Various embodiments of the present disclosure relate to power semiconductor devices and, more particularly, to lateral power integrated devices having a low on-resistance value.

2. Related Art

Integrated devices having functions of both a controller and a driver are often referred to as smart power devices. In general, output circuits of the smart power devices may be designed to include power integrated devices such as lateral double diffused MOS (LDMOS) transistors operating at a high voltage. In the power integrated devices, breakdown voltages of the LDMOS transistors, for example, a drain junction breakdown voltage and a gate dielectric breakdown voltage are important factors that directly influence the stable operation of the LDMOS transistors. In addition, an on-resistance (Ron) value of the LDMOS transistors is also an important factor that influences electrical characteristics of the LDMOS transistors, for example, a current drivability of the LDMOS transistors.

To improve the drain junction breakdown voltage of the LDMOS transistors, a doping concentration of a drift region between a drain region and a channel region has to be reduced or a drift length of carriers in the drift region corresponding to a length of a current path in the drift region has to be increased. However, in such a case, the on-resistance (Ron) of the LDMOS transistors may increase, degrading the current drivability of the LDMOS transistors. When the doping concentration of the drift region between the drain region and the channel region increases or the drift length in the drift region decreases, the on-resistance (Ron) of the LDMOS transistors may be reduced, thereby improving the current drivability of the LDMOS transistors, however the drain junction breakdown voltages of the LDMOS transistors may be lowered. That is, in the LDMOS transistors, the on-resistance and the drain junction breakdown voltage may have a trade-off relationship.

SUMMARY

Various embodiments are directed to lateral power integrated devices having a low on-resistance value.

According to an embodiment, a lateral power integrated device includes a source region and a drain region disposed in a semiconductor layer and spaced apart from each other in a first direction, wherein the semiconductor layer has a first conductivity, wherein each of the source region and the drain region has a second conductivity, a drift region having the second conductivity, disposed in the semiconductor layer, and surrounding the drain region, a channel region arranged between the source region and the drift region in the first direction, a plurality of planar insulation field plates disposed over the drift region and spaced apart from each other in a second direction, wherein the second direction crosses the first direction, a plurality of trench insulation field plates disposed in the drift region, wherein the each of the trench insulation field plates is disposed between the planar insulation field plates in the second direction, a gate insulation layer formed over the channel region, and a gate electrode formed over the gate insulation layer.

According to another embodiment, a lateral power integrated device includes a source region and a drift region disposed in a semiconductor layer and spaced apart from each other in a first direction, wherein the semiconductor layer has a first conductivity, wherein each of the source region and the drain region has a second conductivity, a drain region having the second conductivity and disposed in the drift region, a plurality of planar insulation field plates disposed over the drift region and spaced apart from each other in a second direction, wherein the second direction crosses the first direction, a gate stack including a gate insulation layer and a gate electrode, provided over a channel region between the source region and the drift region, and further extending over a portion of the drift region, and a plurality of gate extensions extending from the gate electrode to over the planar insulation field plates.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
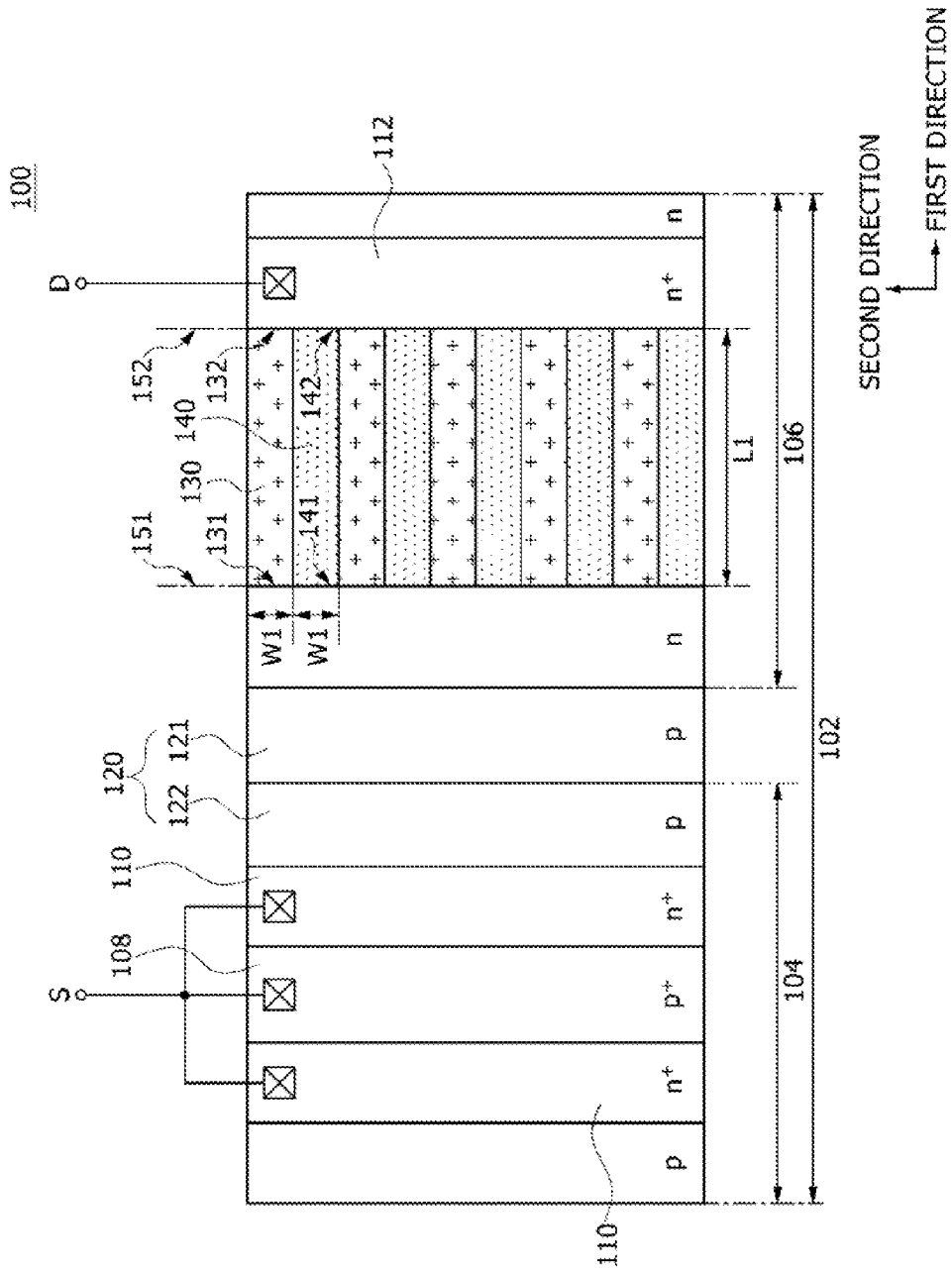
FIG. 1 is a layout diagram illustrating a lateral power integrated device without a gate electrode according to an embodiment.

A trench insulation field plate having a similar structure to a trench isolation layer may be disposed in a drift region between a channel region and a drain region to increase a drain junction breakdown voltage of a planar power integrated device. In such a case, the drain junction breakdown voltage of the planar power integrated device may be improved, but a drift length of carriers in the drift region may increase since the carriers are drifted along sidewalls and a bottom surface of the trench insulation field plate. Thus, an on-resistance value of the planar power integrated device may increase, degrading an on-resistance characteristic of the planar power integrated device.

According to the following embodiments, a plurality of planar insulation field plates and a plurality of trench insulation field plates may be alternately arrayed along a channel width direction to improve an on-resistance characteristic of the planar power integrated device without degradation of a drain junction breakdown voltage characteristic of the planar power integrated device. In addition, according to the following embodiments, when the planar insulation field plates are spaced part from each other in the channel width direction, a gate electrode may be designed so that a length of portions of the gate electrode located between the planar insulation field plates in a channel length direction is greater than a length of the other portions of the gate electrode located on the planar insulation field plates in the channel length direction. As a result, the on-resistance value of the planar power integrated device may be reduced without degradation of the drain junction breakdown voltage characteristic of the planar power integrated device.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on," "over," "above," "under," "beneath," "below," "side," or "aside" another element, it may directly contact the other element, or at least one intervening element may be present therebetween. Accordingly, the terms such as "on," "over," "above," "under," "beneath," "below," "side," "aside," and the like that are used herein are for the purpose of describing only a position relationship of two elements and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 2:
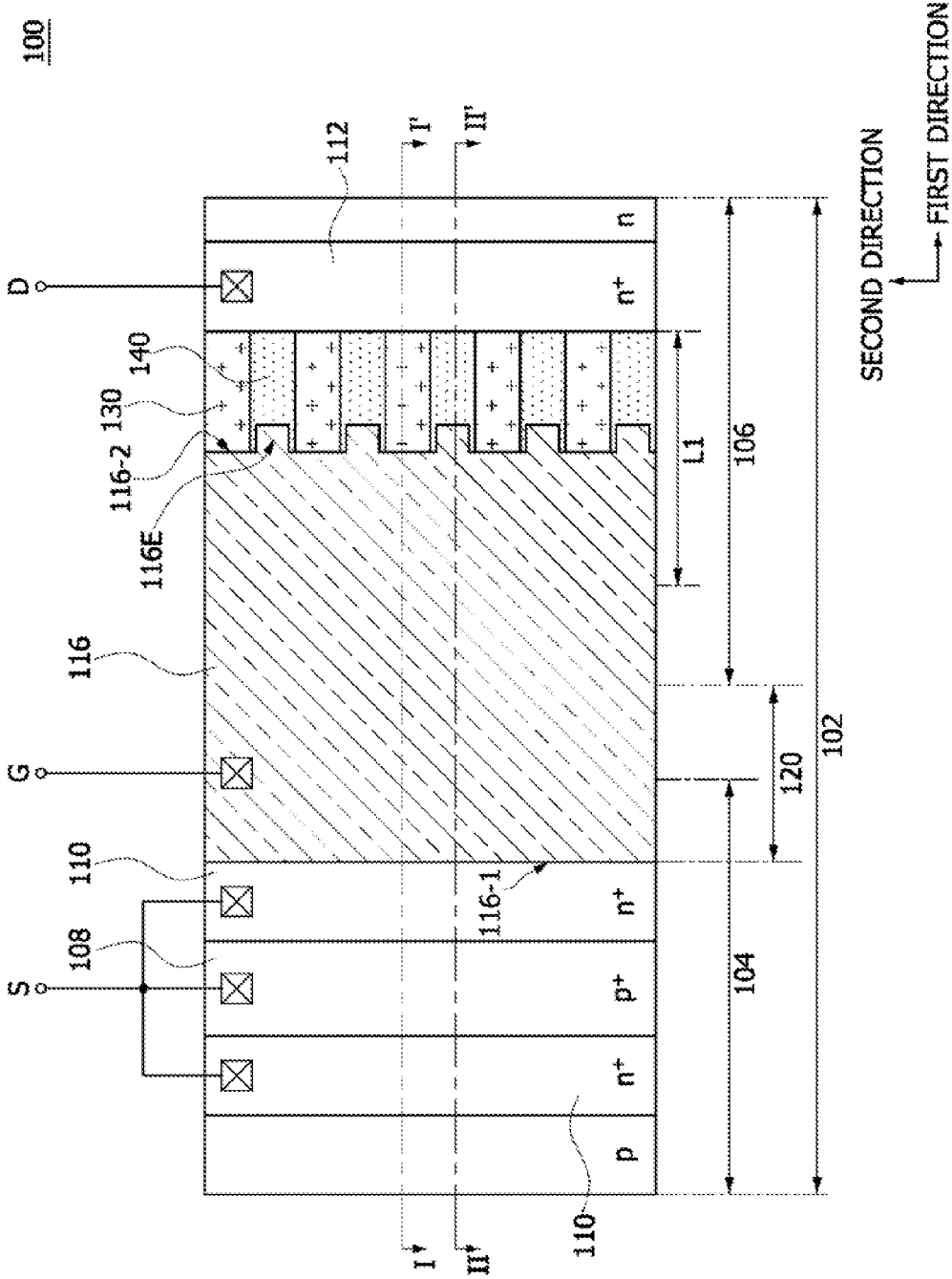
FIG. 2 is a layout diagram illustrating a lateral power integrated device with a gate electrode according to an embodiment.

FIG. 1 is a layout diagram illustrating a lateral power integrated device 100 without a gate electrode 116 according to an embodiment. FIG. 2 is a layout diagram illustrating the lateral power integrated device 100 with the gate electrode 116. In FIG. 2, the same reference numerals as used in FIG. 1 denote the same elements.

As illustrated in FIG. 1, a P-type body region 104 and an N-type drift region 106 may be spaced apart from each other in a first direction. In the present embodiment, the first direction may correspond to a channel length direction, that is, a direction along which carriers move or current flows due to an electric field between a drain region and a source region.

The P-type body region 104 and the N-type drift region 106 may be surrounded by a P-type semiconductor layer 102. The P-type semiconductor layer 102 between the P-type body region 104 and the N-type drift region 106 may correspond to a first channel region 121. A P-type body contact region 108 may be disposed in the P-type body region 104. The P-type body contact region 108 may extend in a second direction intersecting the first direction and has a stripe shape.

A couple of N-type source regions 110 may be disposed at both sides of the P-type body contact region 108, respectively. The couple of N-type source regions 110 may be disposed to directly contact both sidewalls of the P-type body contact region 108, respectively. The P-type body contact region 108 and the N-type source regions 110 may be coupled to a source terminal S in common. An upper portion of the P-type body region 104 between the first channel region 121 and the N-type source regions 110 may correspond to a second channel region 122. The first and second channel regions 121 and 122 may constitute a channel region 120 of the lateral power integrated device 100.

An N-type drain region 112 may be disposed in an edge of the N-type drift region 106 opposite to the channel region 120. The N-type drain region 112 may extend in the second direction and has a stripe shape. A plurality of planar insulation field plates 130 may be disposed on the N-type drift region 106 between the first channel region 121 and the N-type drain region 112. Each of the planar insulation field plates 130 may extend in the first direction and has a stripe shape. The planar insulation field plates 130 may expose an edge of the N-type drift region 106 adjacent to the first channel region 121. The planar insulation field plates 130 may be spaced apart from each other in the second direction.

A plurality of trench insulation field plates 140 may be disposed in portions of the N-type drift region 106 between the planar insulation field plates 130. That is, the planar insulation field plates 130 and the trench insulation field plates 140 may be alternately arrayed in the second direction in a plan view. Thus, a portion of the N-type drift region 106 adjacent to the N-type drain region 112 may be divided into a first region on which the planar insulation field plates 130 are disposed and a second region in which the trench insulation field plates 140 are disposed.

First sidewalls 131 of the planar insulation field plates 130 opposite to the N-type drain region 112 and the first sidewalls 141 of the trench insulation field plates 140 opposite to the N-type drain region 112 may be aligned along a first extension line 151 extending in the second direction when viewed from a plan view. Second sidewalls 132 of the planar insulation field plates 130 opposite to the channel region 120 and second sidewalls 142 of the trench insulation field plates 140 opposite to the channel region 120 may be aligned along a second extension line 152 extending in the second direction when viewed from a plan view.

The second extension line 152 may overlap with a sidewall of the N-type drain region 112 which is parallel with the second direction. Accordingly, the planar insulation field plates 130 and the trench insulation field plates 140 may have substantially the same length L1 in the first direction. The planar insulation field plates 130 and the trench insulation field plates 140 may have substantially the same width W1 in the second direction. Although not shown in FIG. 1, the planar insulation field plates 130 may have bottom surfaces which are located at the same level as a top surface of the N-type drift region 106, and the trench insulation field plates 140 may have top surfaces which are located at the same level as a top surface of the N-type drift region 106. See FIGS. 3 and 4.

That is, the bottom surfaces of the planar insulation field plates 130 may be located at the same level as the top surfaces of the trench insulation field plates 140. The second sidewalls 142 of the trench insulation field plates 140 may be in direct contact with a sidewall of the N-type drain region 112. The N-type drain region 112 may be coupled to a drain terminal D.

As illustrated in FIG. 2, the gate electrode 116 may be disposed to cover the channel region 120, a portion of the N-type drift region 106, a portion of each planar insulation field plate 130, and a portion of each trench insulation field plate 140. See FIGS. 3 and 4. Although not shown in FIG. 2, a gate insulation layer may be disposed between the gate electrode 116 and the channel region 120 as well as between the gate electrode 116 and the N-type drift region 106. The gate insulation layer may extend onto a portion of each trench insulation field plate 140.

A first sidewall 116-1 of the gate electrode 116 may be aligned with or may overlap with a sidewall of the N-type source region 110 contacting the channel region 120. A second sidewall 116-2 of the gate electrode 116 may be located on the planar insulation field plates 130 and the trench insulation field plates 140. Thus, an edge of the gate electrode 116 opposite to the N-type source regions 110 and adjacent to the second sidewall 116-2 may overlap with the planar insulation field plates 130 and the trench insulation field plates 140.

The gate electrode 116 may include gate extension portions 116E protruding from the second sidewall 116-2 in the first direction. The gate extension portions 116E may be spaced apart from each other in the second direction. In particular, the gate extension portions 116E may overlap with the trench insulation field plates 140 respectively, without overlapping with the planar insulation field plates 130. The gate electrode 116 may be coupled to a gate terminal G.

Figure 3:
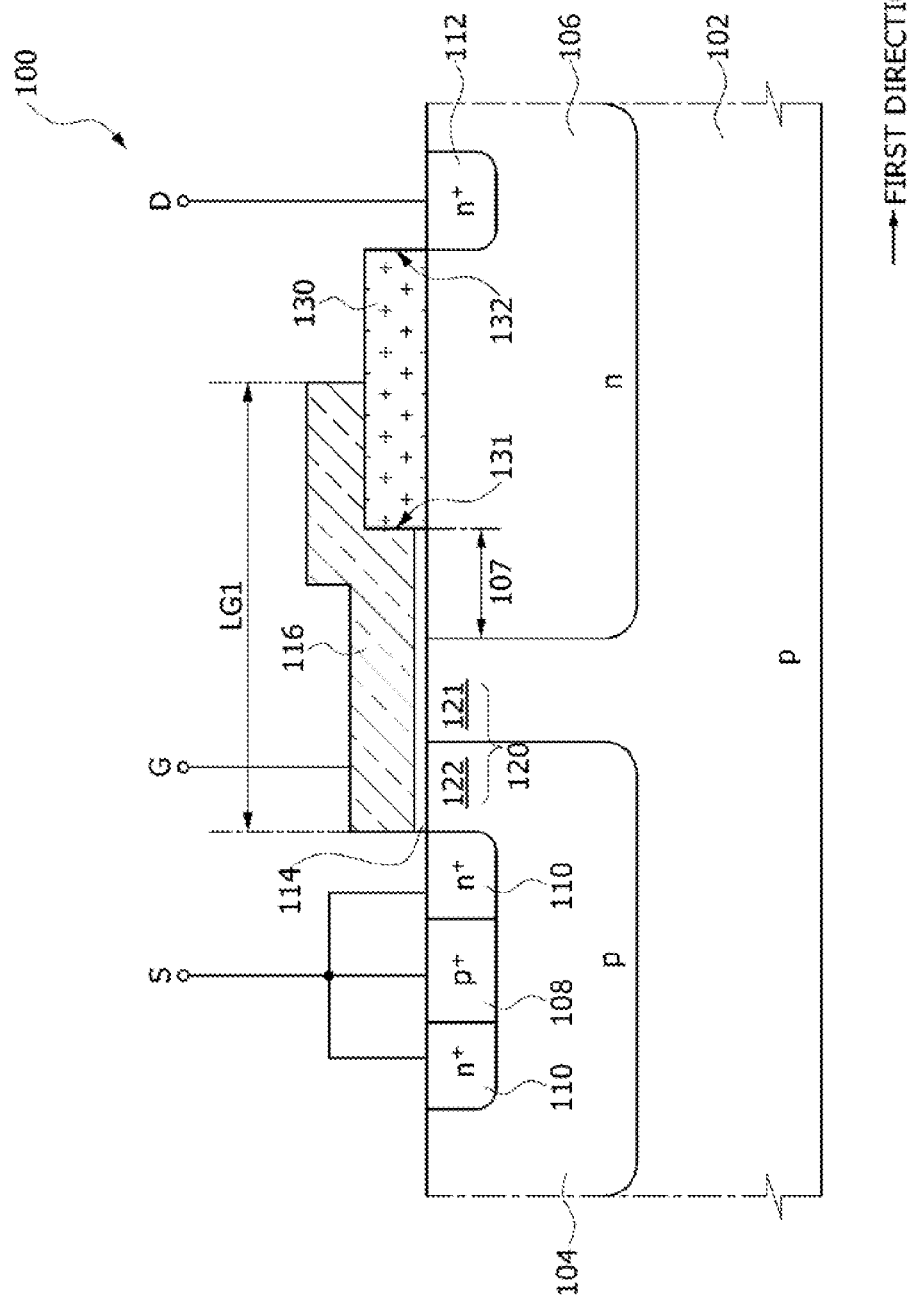
FIG. 3 is a cross-sectional view taken along the line I-I' of FIG. 2.

FIG. 3 is a cross-sectional view taken along the line I-I' of FIG. 2. That is, FIG. 3 includes the first region of the N-type drift region 106 and the planar insulation field plate 130 disposed on the first region of the N-type drift region 106. Referring to FIG. 3, the P-type body region 104 and the N-type drift region 106 may be disposed in an upper portion of the P-type semiconductor layer 102 and be spaced apart from each other in the first direction.

In some embodiments, the P-type semiconductor layer 102 may be a P-type semiconductor substrate. In some other embodiments, the P-type semiconductor layer 102 may be a P-type well region such as a P-type junction region formed in an upper portion of a semiconductor substrate. Alternatively, the P-type semiconductor layer 102 may be a P-type epitaxial layer grown on a semiconductor substrate.

An upper portion of the P-type semiconductor layer 102 between the P-type body region 104 and the N-type drift region 106 may be defined as the first channel region 121. The P-type body contact region 108 may be disposed in an upper portion of the P-type body region 104. The N-type source regions 110 may be disposed in an upper portion of the P-type body region 104 and may be located at both sides of the P-type body contact region 108, respectively. A sidewall of each N-type source region 110 and a sidewall of the P-type body contact region 108 may be in direct contact with each other to provide a metallurgical junction. The P-type body contact region 108 and the N-type source regions 110 may be coupled to the source terminal S in common.

An upper portion of the P-type body region 104 between the first channel region 121 and the N-type source regions 110 may be defined as the second channel region 122. The first and second channel regions 121 and 122 may constitute the channel region 120 of the lateral power integrated device 100.

The N-type drain region 112 may be disposed in an upper portion of the N-type drift region 106. The N-type drain region 112 may be disposed in an edge portion of the N-type drift region 106 opposite to the channel region 120. The N-type drain region 112 may be coupled to the drain terminal D. Each of the plurality of planar insulation field plates 130 may be disposed on the first region of the N-type drift region 106. Each of the planar insulation field plates 130 may have a bottom surface which is located at the same level as a top surface of the N-type drift region 106. Thus, each planar insulation field plate 130 may vertically protrude from the top surface of the N-type drift region 106 by a thickness of the planar insulation field plate 130.

Each planar insulation field plate 130 may have the first sidewall 131 and the second sidewall 132 in the first direction. The first sidewall 131 of each planar insulation field plate 130 adjacent to the channel region 120 may define an accumulation region 107 in the N-type drift region 106. That is, the accumulation region 107 may be defined as an upper portion of the N-type drift region 106 between the first channel region 121 and the planar insulation field plate 130. The second sidewall 132 of each planar insulation field plate 130 adjacent to the N-type drain region 112 may be vertically aligned with a sidewall of the N-type drain region 112.

A gate insulation layer 114 may be disposed on the channel region 120 and the accumulation region 107. The gate electrode 116 may be disposed on the gate insulation layer 114. The gate electrode 116 may be coupled to the gate terminal G. In some embodiments, the gate insulation layer 114 may include an oxide layer, and the gate electrode 116 may include a polysilicon layer doped with impurity ions. The gate electrode 116 may extend onto the planar insulation field plate 130.

The gate electrode 116, which overlaps the planar insulation field plate 130 on the first region of the N-type drift region 106, may have a first gate length LG1 in the first direction. A portion of the gate electrode 116 which is disposed on the planar insulation field plate 130 may serve as a conductive field plate.

Figure 4:
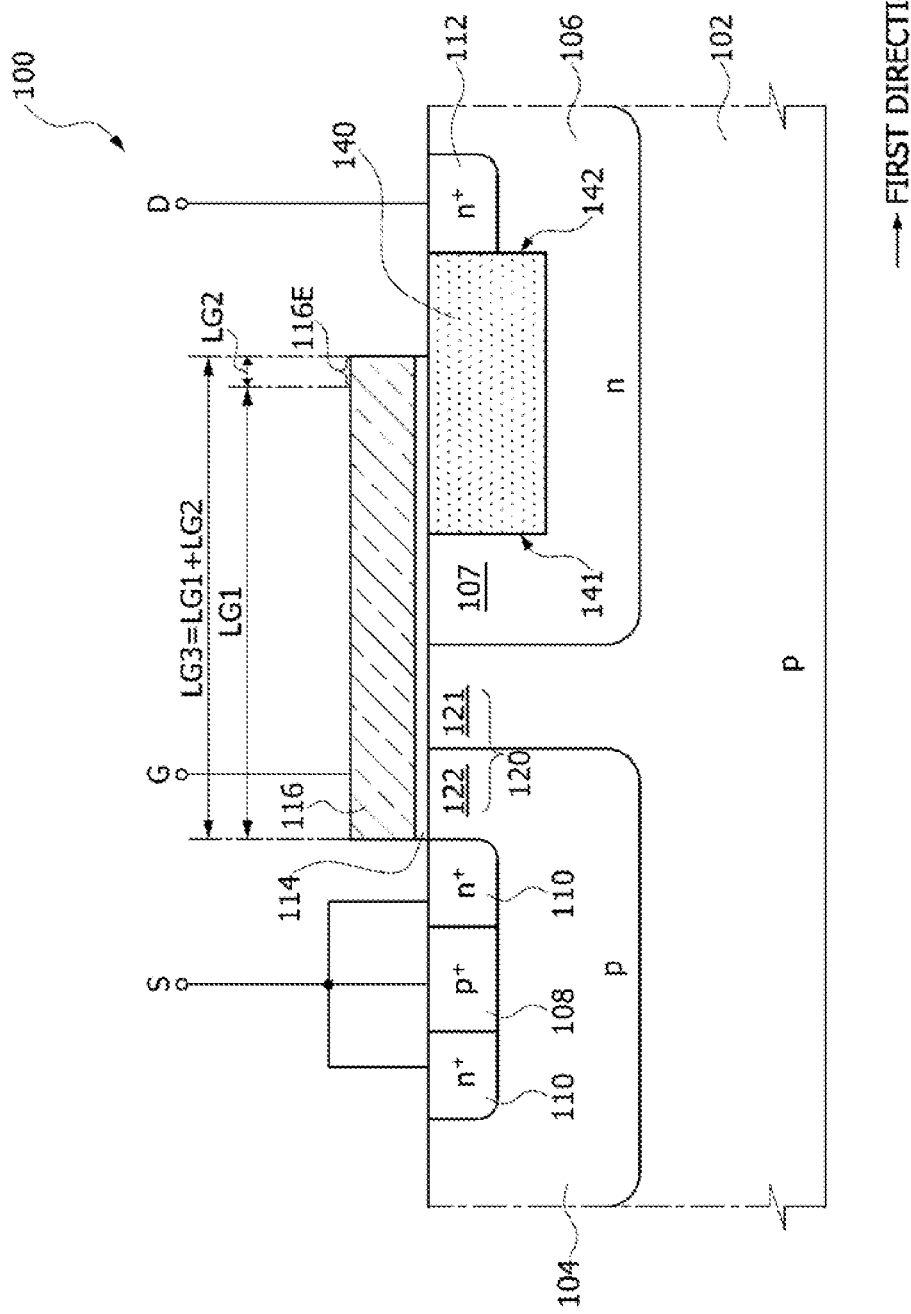
FIG. 4 is a cross-sectional view taken along the line II-II' of FIG. 2.

FIG. 4 is a cross-sectional view taken along the line II-II' of FIG. 2. That is, FIG. 4 includes the second region of the N-type drift region 106 and the trench insulation field plate 140 disposed in the second region of the N-type drift region 106. In FIG. 4, the same reference numerals as used in FIG.

3 denote the same elements. Thus, descriptions of the same elements as set forth with reference to FIG. 3 will be omitted or briefly mentioned hereinafter to avoid duplicate description.

Referring to FIG. 4, each of the trench insulation field plates 140 may be disposed in the second region of the N-type drift region 106. The trench insulation field plate 140 may fill a trench that is formed in N-type drift region 106 to have a certain depth from a top surface of the N-type drift region 106. The trench insulation field plate 140 may have a top surface which is located at the same level as the top surface of the N-type drift region 106. In some embodiments, the trench insulation field plate 140 may have a thickness which is greater than a junction depth of the N-type drain region 112.

The trench insulation field plate 140 may be disposed in the N-type drift region 106 to have the first sidewall 141 and the second sidewall 142 which are arranged in the first direction. The first sidewall 141 of the planar insulation field plate 140 adjacent to the channel region 120 may define the accumulation region 107 in the N-type drift region 106. That is, the accumulation region 107 may be defined as an upper portion of the N-type drift region 106 between the first channel region 121 and the first sidewall 141. The second sidewall 142 of the planar insulation field plate 140 adjacent to the N-type drain region 112 may be in direct contact with a sidewall of the N-type drain region 112.

The gate insulation layer 114 may be disposed on the channel region 120 and the accumulation region 107. The gate insulation layer 114 may extend onto a portion of the planar insulation field plate 140. The gate electrode 116 may be disposed on the gate insulation layer 114.

The gate electrode 116 may include the gate extension portions 116E that extend from an end of the gate electrode 116 toward the N-type drain region 112. Thus, the gate electrode 116, which overlaps the trench insulation field plate 140 in the second region of the N-type drift region 106, may have a second gate length LG3 corresponding to a sum of the first gate length LG1 that is, a length of the gate electrode 116 disposed on the first region of the N-type drift region 106 and a length LG2 of the gate extension portions 116E when measured in the first direction. A portion of the gate electrode 116 disposed on the trench insulation field plate 140 may serve as a conductive field plate.

As described with reference to FIGS. 1 to 4, the lateral power integrated device 100 may be configured to include the first regions of the N-type drift region 106 and the second regions of the N-type drift region 106 which are alternately arrayed in the second direction. The planar insulation field plates 130 may be disposed on the first regions of the N-type drift region 106, respectively. The trench insulation field plates 140 may be disposed in the second regions of the N-type drift region 106, respectively.

A drift length of carriers in the second regions of the N-type drift region 106 may increase due to the presence of the trench insulation field plates 140. Thus, a peak electric field at a junction region between the first channel region 121 and the N-type drift region 106 may be lowered, thereby increasing a drain junction breakdown voltage of the lateral power integrated device 100.

Since the carriers in the first regions of the N-type drift region 106 may be drifted along the sidewalls and the bottom surface of the trench insulation field plates 140, an on-resistance value of the lateral power integrated device 100 may increase. However, according to the embodiment, a drift length of carriers in the first regions of the N-type drift region 106 may be reduced due to the absence of the trench insulation field plates 140 which compensates for an increase of the on-resistance value of the lateral power integrated device 100.

That is, the carriers in the first regions of the N-type drift region 106 may be drifted along a top of the N-type drift region 106 under the planar insulation field plates 130. Thus, the first regions of the N-type drift region 106 may provide a relatively shorter drift length as compared with the second regions of the N-type drift region 106. As a result, the first regions of the N-type drift region 106 may prevent an on-resistance characteristic of the lateral power integrated device 100 from being degraded.

In addition, the planar insulation field plates 130 disposed on the first regions of the N-type drift region 106 may reduce an electric filed between the N-type drain region 112 and the gate electrode 116 and compensates for a reduction of a drain junction breakdown voltage in the first regions of the N-type drift region 106. Accordingly, the lateral power integrated device 100 may exhibit an improved on-resistance characteristic without degradation of a drain junction breakdown voltage characteristic.

Figure 5:
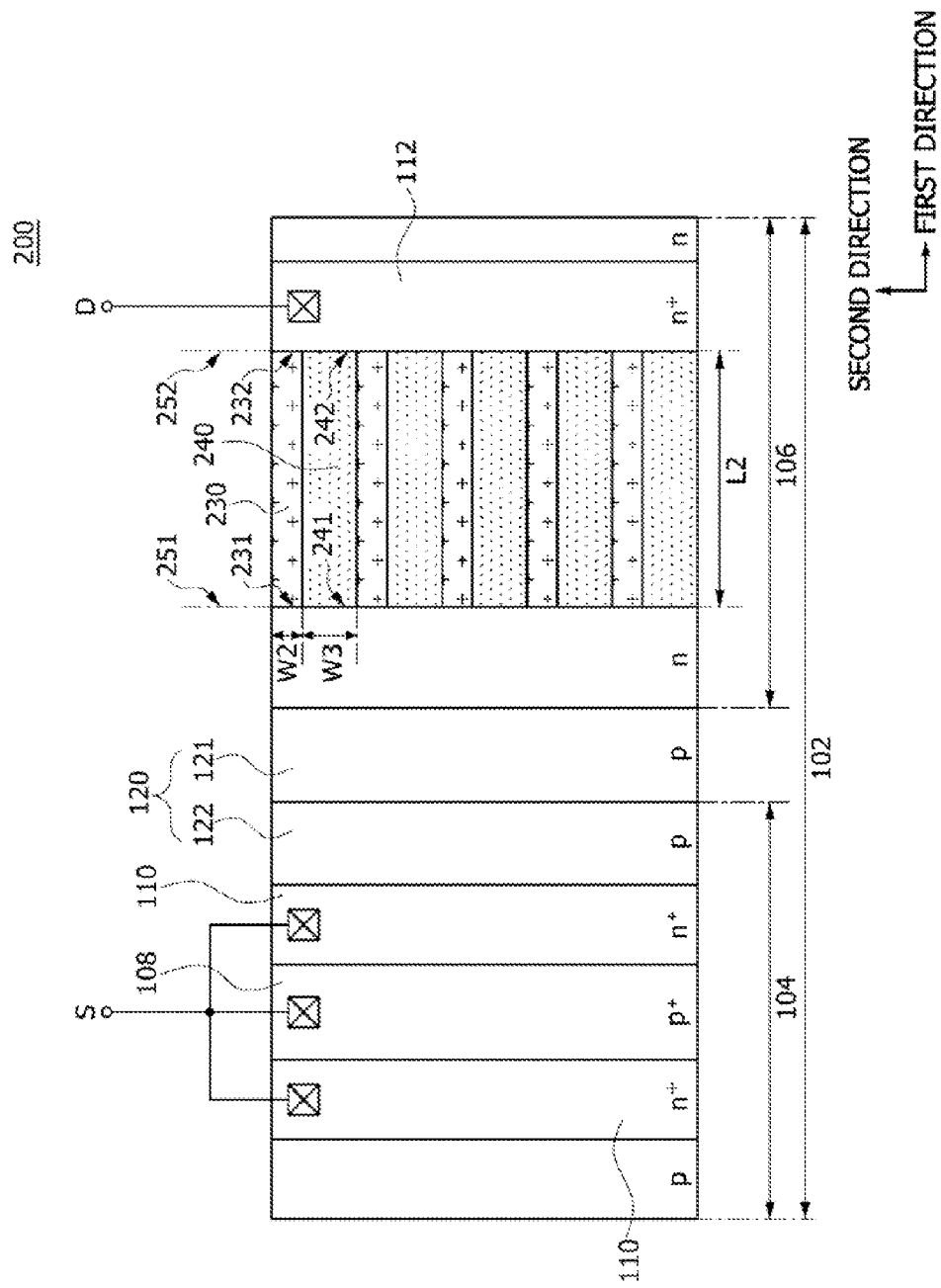
FIG. 5 is a layout diagram illustrating a lateral power integrated device without a gate electrode according to another embodiment.
Figure 6:
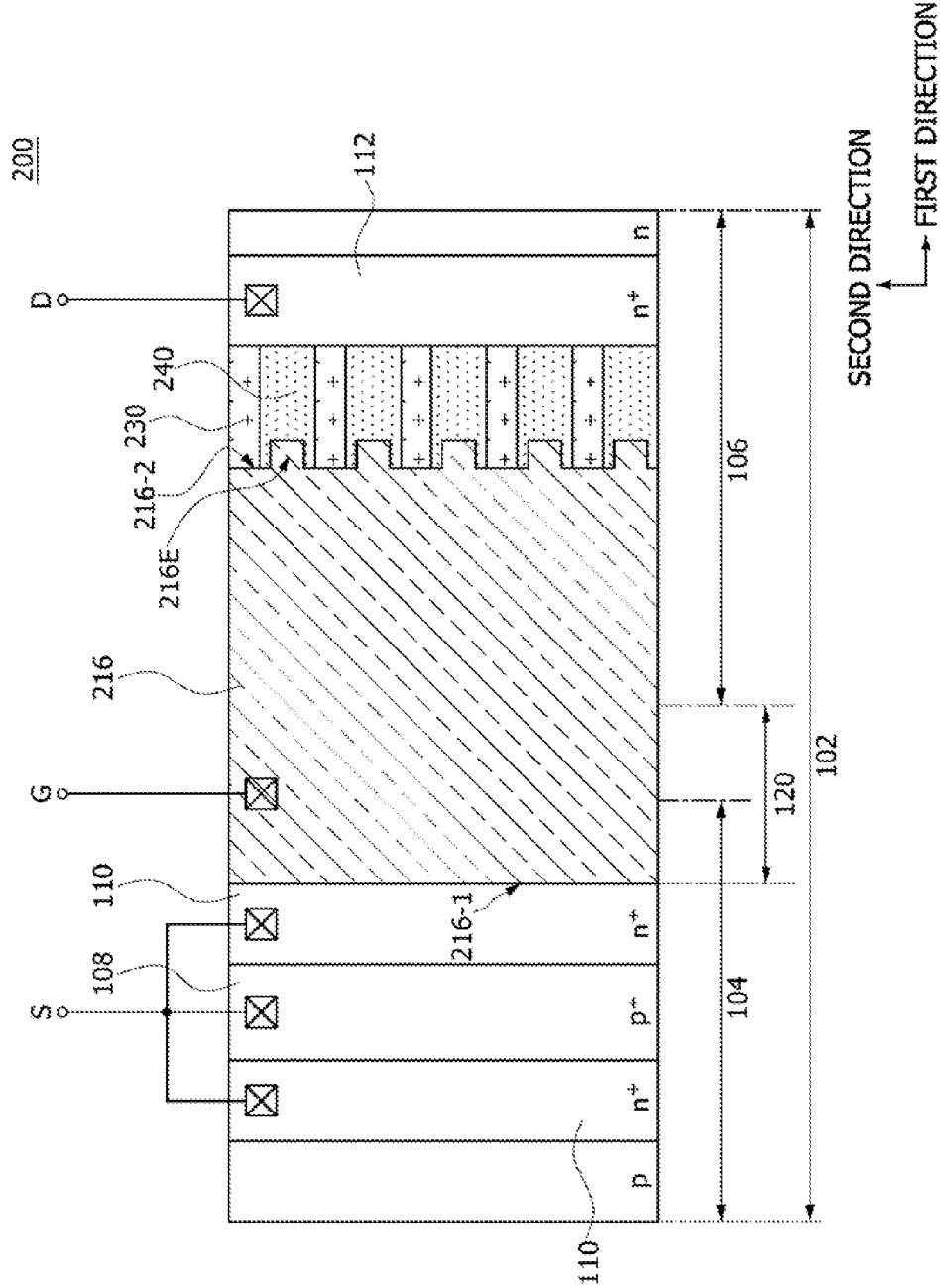
FIG. 6 is a layout diagram illustrating a lateral power integrated device with a gate electrode according to another embodiment.

FIG. 5 is a layout diagram illustrating a lateral power integrated device 200 without a gate electrode 216 according to another embodiment. FIG. 6 is a layout diagram illustrating the lateral power integrated device 200 with the gate electrode 216. In FIGS. 5 and 6, the same reference numerals as used in FIGS. 1 and 2 denote the same elements.

Referring to FIGS. 5 and 6, a portion of the N-type drift region 106 adjacent to the N-type drain region 112 may be divided into a first region in which a plurality of planar insulation field plates 230 are disposed and a second region in which a plurality of trench insulation field plates 240 are disposed.

The planar insulation field plates 230 and the trench insulation field plates 240 may be alternately arrayed in a second direction corresponding to a channel width direction in a plan view. The planar insulation field plates 230 may be disposed on the N-type drift region 106 between the N-type drain region 112 and the first channel region 121. The trench insulation field plates 240 may be disposed in the N-type drift region 106 between the N-type drain region 112 and the first channel region 121.

A vertical cross-sectional view taken along each planar insulation field plate 230 in a first direction intersecting the second direction may have substantially the same structure as the vertical cross-sectional view shown in FIG. 3, and a vertical cross-sectional view taken along each trench insulation field plate 240 in the first direction may have substantially the same structure as the vertical cross-sectional view shown in FIG. 4.

First sidewalls 231 of the planar insulation field plates 230 opposite to the N-type drain region 112 and the first sidewalls 241 of the trench insulation field plates 240 opposite to the N-type drain region 112 may be aligned with each other along a first extension line 251 which extends in the second direction when viewed from a plan view. Second sidewalls 232 of the planar insulation field plates 230 opposite to the channel region 120 and second sidewalls 242 of the trench insulation field plates 240 opposite to the channel region 120 may be aligned with each other along a second extension line 252 extending in the second direction when viewed from a plan view.

The second extension line 252 may overlap with a sidewall of the N-type drain region 112 which is parallel with the second direction. Accordingly, the planar insulation field plates 230 and the trench insulation field plates 240 may have substantially the same length L2 when measured in the first direction.

The gate electrode 216 may be disposed to cover the channel region 120, a portion of the N-type drift region 106, a portion of each planar insulation field plate 230, and a portion of each trench insulation field plate 240. Although not shown in the layout diagrams of FIGS. 5 and 6, a gate insulation layer may be disposed between the gate electrode 216 and the channel region 120 as well as between the gate electrode 216 and the N-type drift region 106. The gate insulation layer may extend onto a portion of each trench insulation field plate 240.

A first sidewall 216-1 of the gate electrode 216 may be aligned with or may overlap with a sidewall of the N-type source region 110 contacting the channel region 120. A second sidewall 216-2 of the gate electrode 216 may be located on the planar insulation field plates 230 and the trench insulation field plates 240. Thus, an edge of the gate electrode 216 may overlap with the planar insulation field plates 230 and the trench insulation field plates 240.

The gate electrode 216 may include gate extension portions 216E protruding from the second sidewall 216-2 in the first direction. The gate extension portions 216E of the gate electrode 216 may be spaced apart from each other in the second direction. In particular, the gate extension portions 216E may overlap the trench insulation field plates 240 respectively, but may not overlap the planar insulation field plates 230. The gate electrode 216 may be coupled to a gate terminal G.

Each of the planar insulation field plates 230 may have a first width W2 in the second direction. Each of the trench insulation field plates 240 may have a second width W3 in the second direction. The second width W3 of the trench insulation field plates 240 may be greater than the first width W2 of the planar insulation field plates 230. Thus, according to the present embodiment, a drain junction breakdown voltage characteristic rather than an on-resistance characteristic may be more improved since a width of the second region of the N-type drift region 106 relating to the second width W3 of the trench insulation field plates 240 that increase a drift length of carriers, is greater than a width of the first region of the N-type drift region 106 relating to the first width W2 of the planar insulation field plates 230. Accordingly, the lateral power integrated device 200 according to the present embodiment may be suitable for electronic devices or systems that are more influenced by a drain junction breakdown voltage characteristic rather than an on-resistance characteristic of the lateral power integrated device 200.

Figure 7:
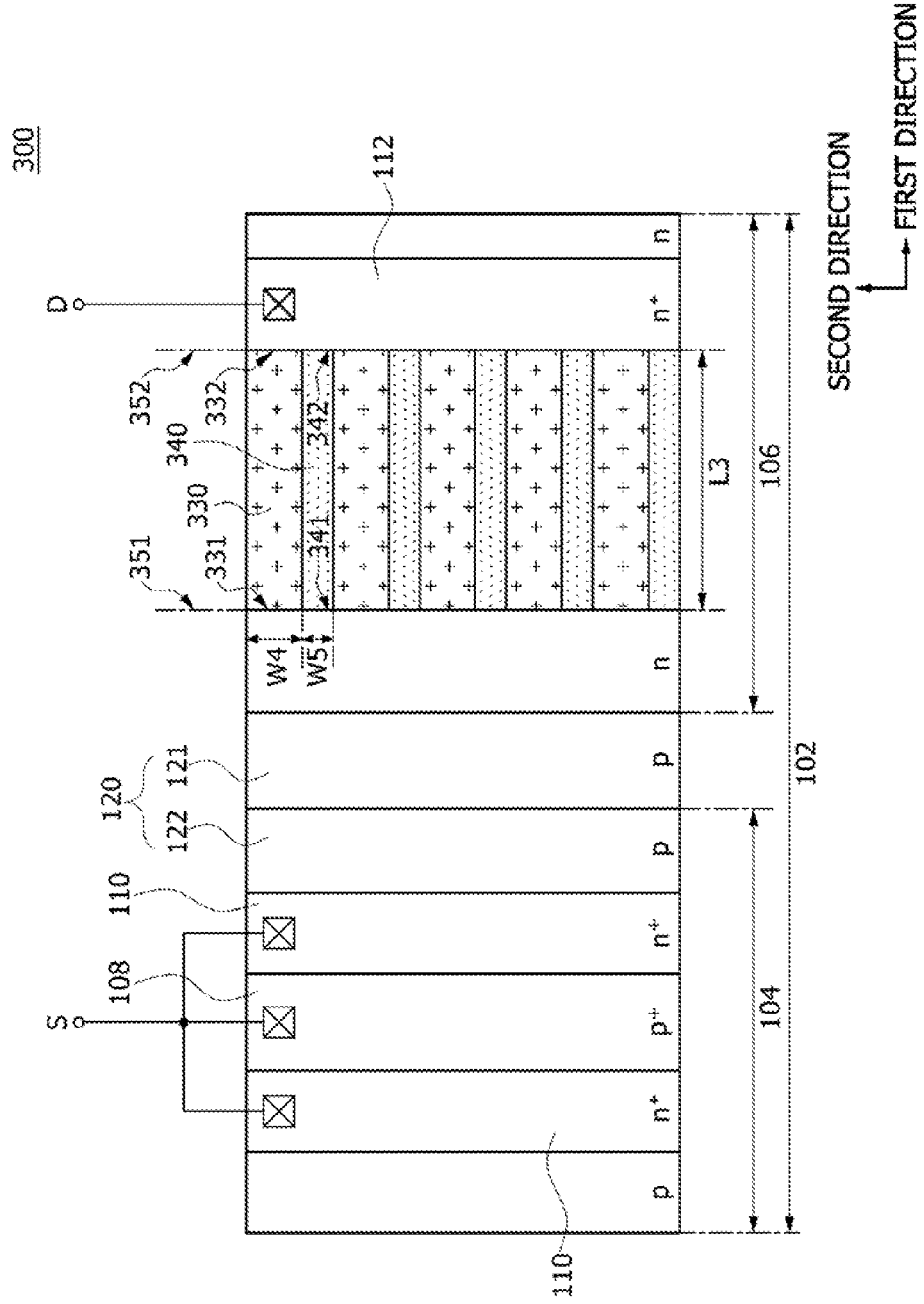
FIG. 7 is a layout diagram illustrating a lateral power integrated device without a gate electrode according to yet another embodiment.
Figure 8:
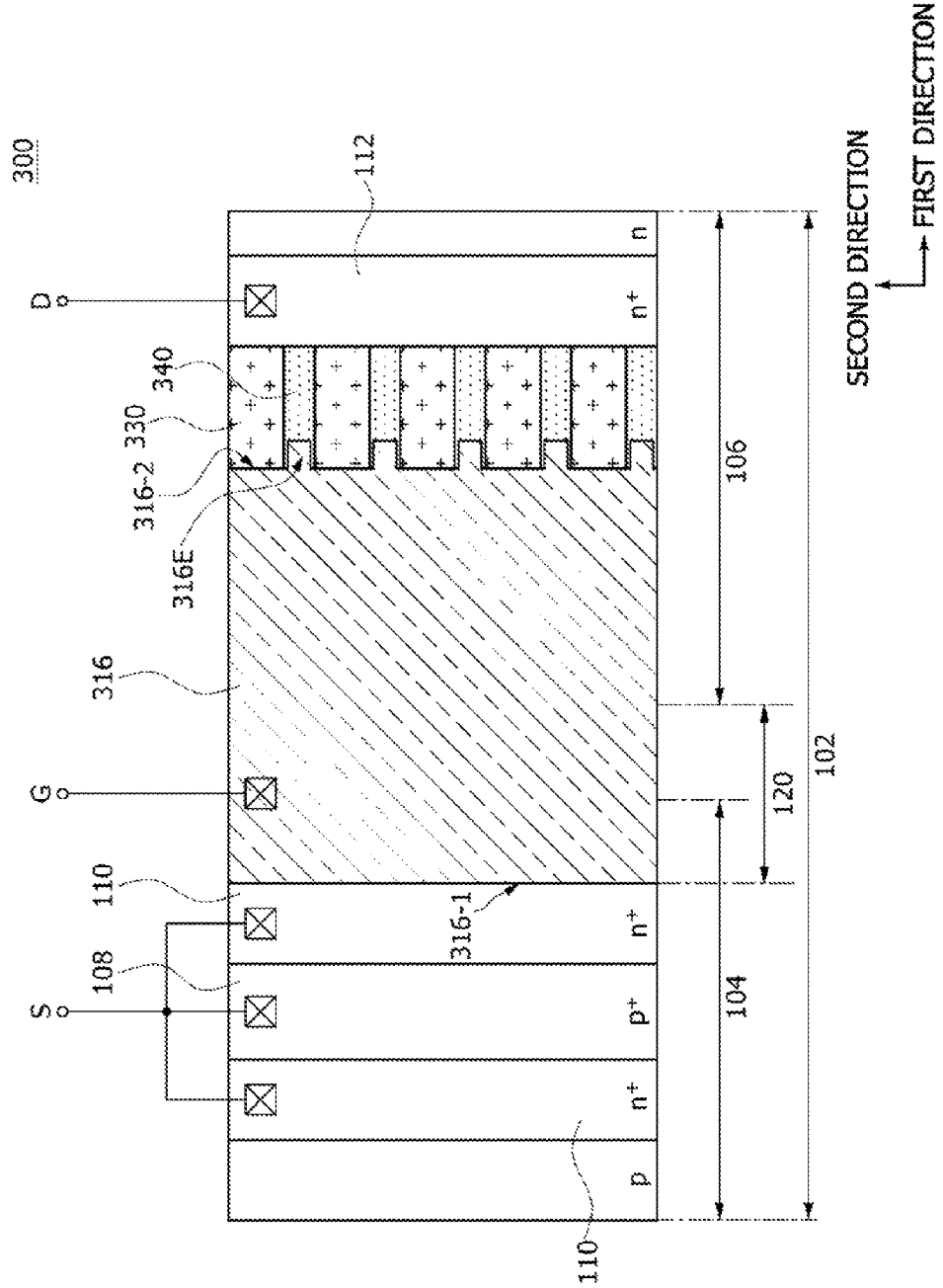
FIG. 8 is a layout diagram illustrating a lateral power integrated device with a gate electrode according to yet another embodiment.

FIG. 7 is a layout diagram illustrating a lateral power integrated device 300 without a gate electrode 316 according to yet another embodiment. FIG. 8 is a layout diagram illustrating the lateral power integrated device 300 with the gate electrode 316. In FIGS. 7 and 8, the same reference numerals as used in FIGS. 1 and 2 denote the same elements.

Referring to FIGS. 7 and 8, the N-type drift region 106 adjacent to the N-type drain region 112 may be divided into a first region on which a plurality of planar insulation field plates 330 are disposed and a second region in which a plurality of trench insulation field plates 340 are disposed. The planar insulation field plates 330 and the trench insulation field plates 340 may be alternately arrayed in a second direction corresponding to a channel width direction in a plan view. The planar insulation field plates 330 may be disposed on the N-type drift region 106 between the N-type drain region 112 and the first channel region 121. The trench insulation field plates 340 may be disposed in the N-type drift region 106 between the N-type drain region 112 and the first channel region 121.

A vertical cross-sectional view taken along each planar insulation field plate 330 in a first direction intersecting the second direction may have substantially the same structure as the vertical cross-sectional view shown in FIG. 3, and a vertical cross-sectional view taken along each trench insulation field plate 340 in the first direction may have substantially the same structure as the vertical cross-sectional view shown in FIG. 4.

First sidewalls 331 of the planar insulation field plates 330 opposite to the N-type drain region 112 and the first sidewalls 341 of the trench insulation field plates 340 opposite to the N-type drain region 112 may be aligned with each other along a first extension line 351 extending in the second direction when viewed from a plan view. Second sidewalls 332 of the planar insulation field plates 330 opposite to the channel region 120 and second sidewalls 342 of the trench insulation field plates 340 opposite to the channel region 120 may be aligned with each other along a second extension line 352 extending in the second direction when viewed from a plan view.

The second extension line 352 may overlap with a sidewall of the N-type drain region 112 which is parallel with the second direction. Accordingly, the planar insulation field plates 330 and the trench insulation field plates 340 may have substantially the same length 13 in the first direction.

The gate electrode 316 may cover the channel region 120, a portion of the N-type drift region 106, a portion of each planar insulation field plate 330, and a portion of each trench insulation field plate 340. Although not shown in the layout diagrams of FIGS. 7 and 8, a gate insulation layer may be disposed between the gate electrode 316 and the channel region 120 as well as between the gate electrode 316 and the N-type drift region 106. The gate insulation layer may extend onto a portion of each trench insulation field plate 340.

A first sidewall 316-1 of the gate electrode 316 may be aligned with or may overlap with a sidewall of the N-type source region 110 contacting the channel region 120. A second sidewall 316-2 of the gate electrode 316 may be located on the planar insulation field plates 330 and the trench insulation field plates 340. Thus, an edge of the gate electrode 316 opposite to the N-type source regions 110 and adjacent to the second sidewall 316-2 may overlap with the planar insulation field plates 330 and the trench insulation field plates 340.

The gate electrode 316 may include gate extension portions 316E protruding from the second sidewall 316-2 in the first direction. The extension portions 316E of the gate electrode 316 may be spaced apart from each other in the second direction. In particular, the gate extension portions 316E may overlap the trench insulation field plates 340 respectively, but may not overlap the planar insulation field plates 330. The gate electrode 316 may be coupled to a gate terminal G.

Each of the planar insulation field plates 330 may have a first width W4 in the second direction. Each of the trench insulation field plates 340 may have a second width W5 in the second direction. The second width W5 of the trench insulation field plates 340 may be less than the first width W4 of the planar insulation field plates 330.

Thus, according to the present embodiment, an on-resistance characteristic rather than a drain junction breakdown voltage characteristic may be more improved since a width of the second region of the N-type drift region 106 relating to the second width W5 of the trench insulation field plates 340 that increase a drift length of carriers is less than a width of the first region of the N-type drift region 106 relating to the first width W4 of the planar insulation field plates 330. Accordingly, the lateral power integrated device 300 according to the present embodiment may be suitable for electronic devices or systems that are more influenced by an on-resistance characteristic rather than a drain junction breakdown voltage characteristic of the lateral power integrated device 300.

Figure 9:
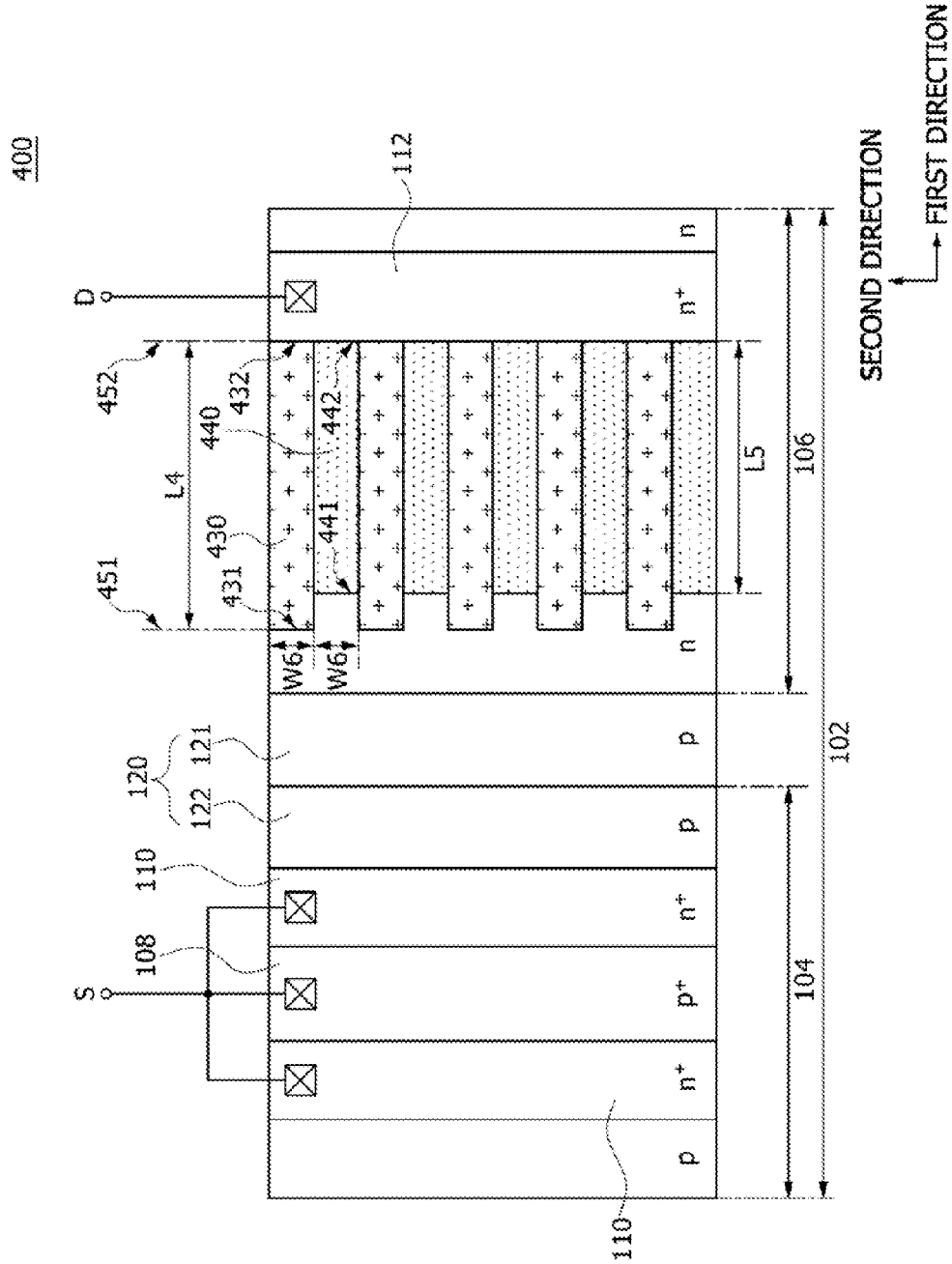
FIG. 9 is a layout diagram illustrating a lateral power integrated device without a gate electrode according to still another embodiment.
Figure 10:
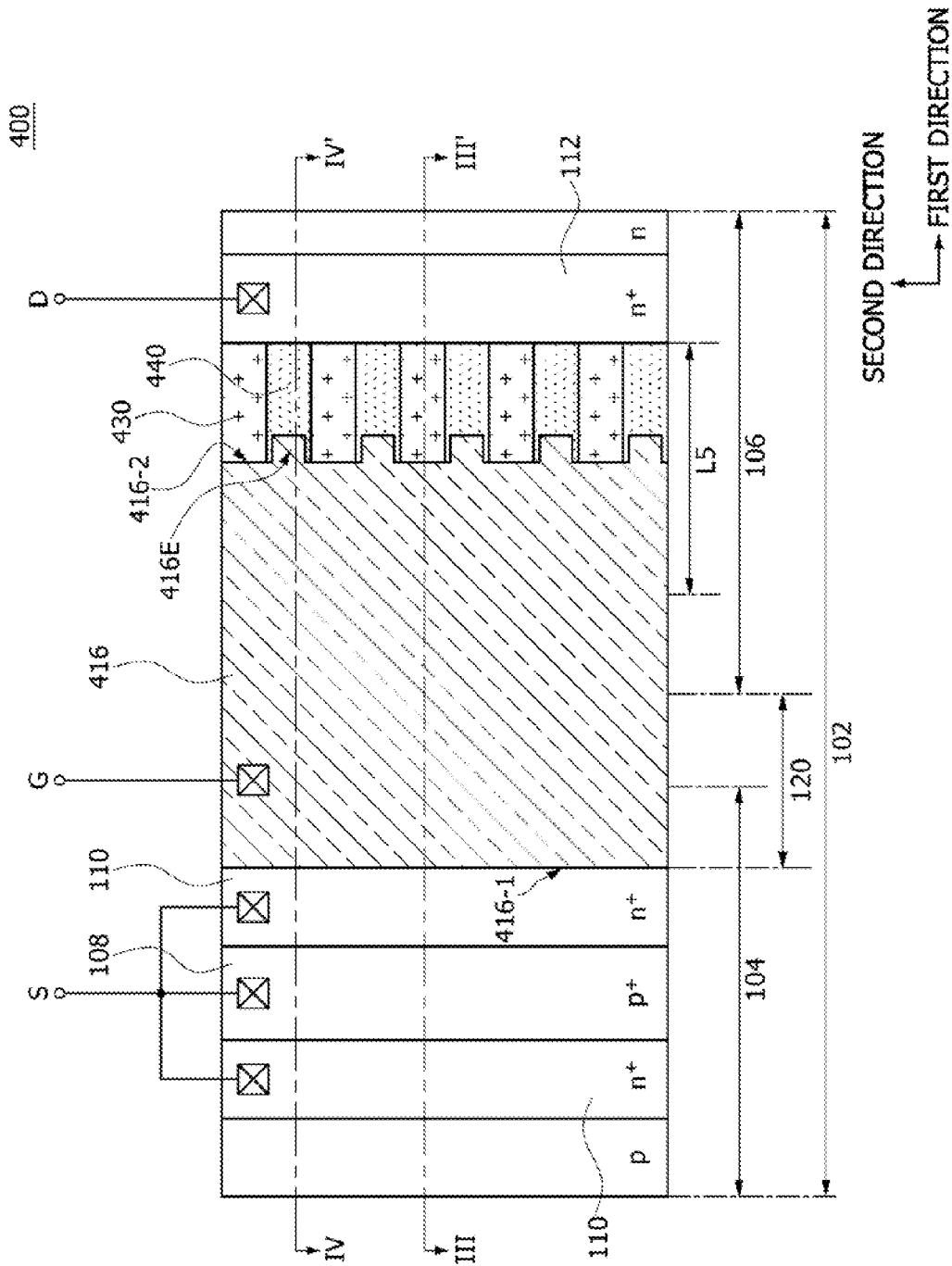
FIG. 10 is a layout diagram illustrating a lateral power integrated device with a gate electrode according to still another embodiment.
Figure 11:
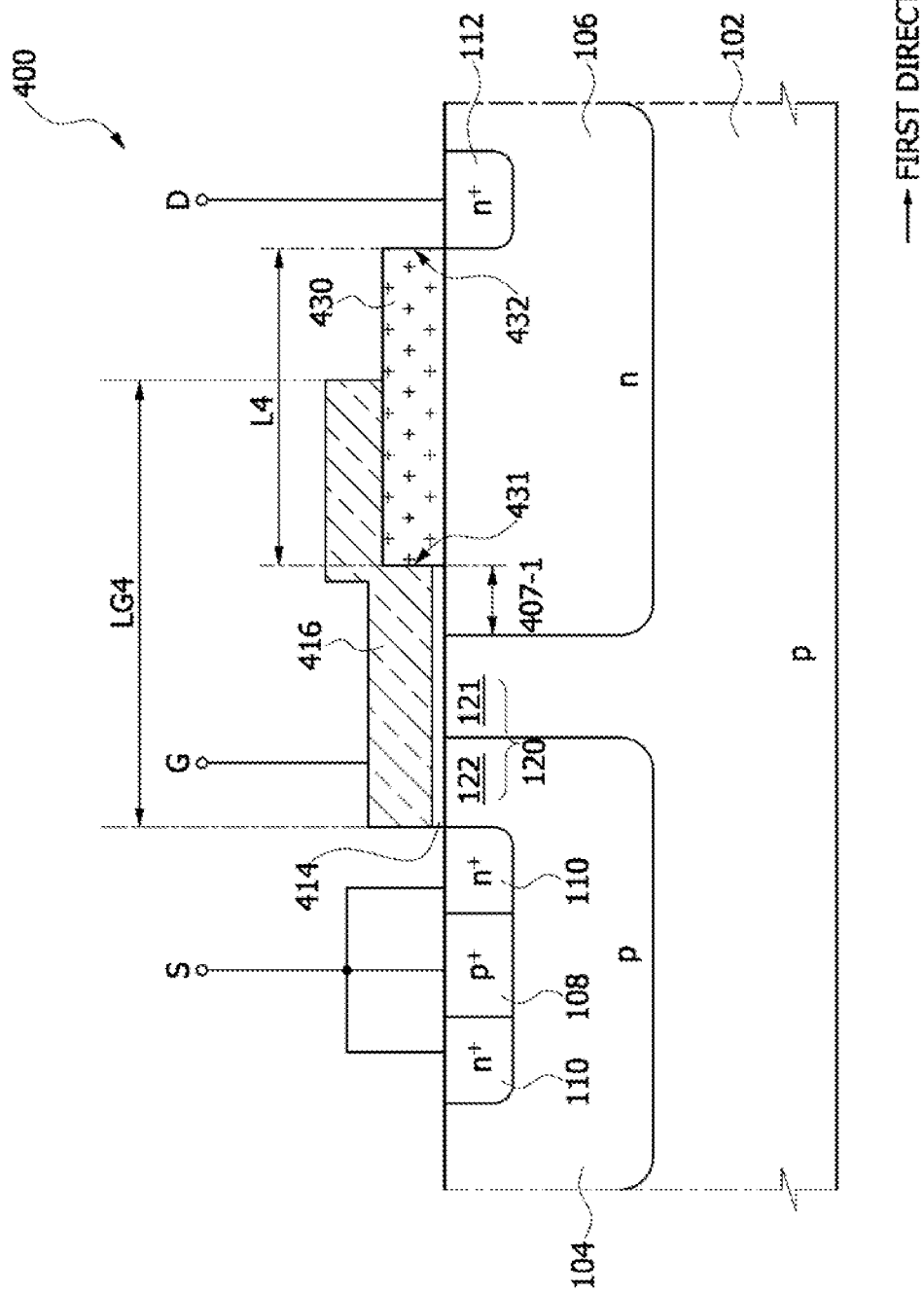
FIG. 11 is a cross-sectional view taken along the line III-III' of FIG. 10.
Figure 12:
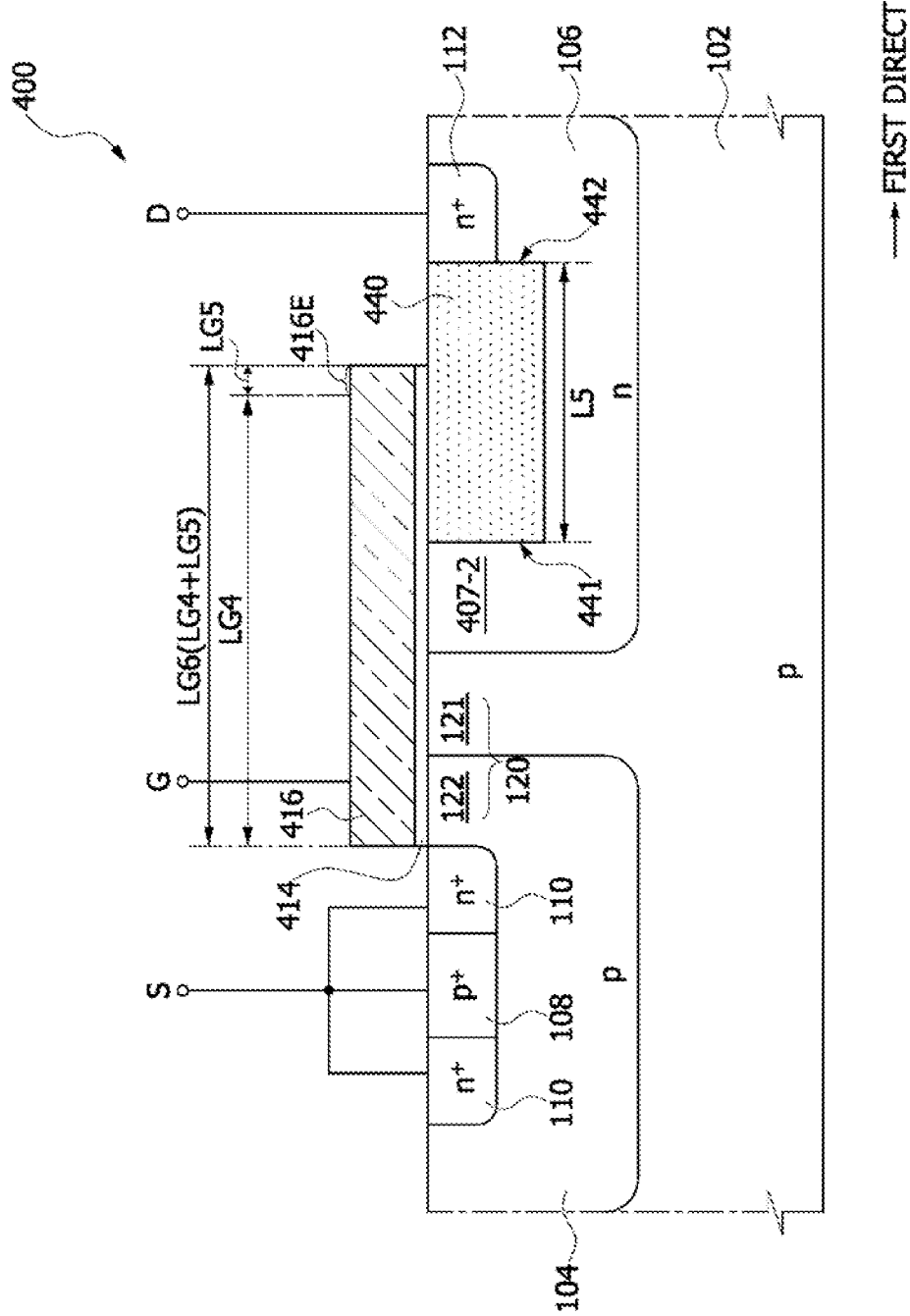
FIG. 12 is a cross-sectional view taken along the line IV-IV' of FIG. 10.

FIG. 9 is a layout diagram illustrating a lateral power integrated device 400 according to still another embodiment without a gate electrode 416, and FIG. 10 is a layout diagram illustrating the lateral power integrated device 400 with the gate electrode 416. In addition, FIG. 11 is a cross-sectional view taken along the line III-III' of FIG. 10, and FIG. 12 is a cross-sectional view taken along the line IV-IV' of FIG. 10. In FIGS. 9 to 12, the same reference numerals as used in FIGS. 1 to 4 denote the same elements. Thus, descriptions of the same elements as set forth with reference to FIGS. 1 to 4 will be omitted or briefly mentioned hereinafter to avoid duplicate description.

Referring to FIGS. 9 to 12, a portion of the N-type drift region 106 adjacent to the N-type drain region 112 may be divided into a first region in which a plurality of planar insulation field plates 430 are disposed and a second region in which a plurality of trench insulation field plates 440 are disposed. The planar insulation field plates 430 and the trench insulation field plates 440 may be alternately arrayed in a second direction corresponding to a channel width direction in a plan view.

The planar insulation field plates 430 may be disposed on the N-type drift region 106 between the N-type drain region 112 and the first channel region 121. The trench insulation field plates 440 may be disposed in the N-type drift region 106 between the N-type drain region 112 and the first channel region 121. The planar insulation field plates 430 and the trench insulation field plates 440 may have substantially the same width W6 when measured in the second direction.

First sidewalls 431 of the planar insulation field plates 430 opposite to the N-type drain region 112 may extend to a first extension line 451 which is extending in the second direction when viewed from a plan view. First sidewalls 441 of the trench insulation field plates 440 opposite to the N-type drain region 112 may extend to a point shorter than the planar insulation field plates 430 toward the first extension line 451.

Second sidewalls 432 of the planar insulation field plates 430 opposite to the channel region 120 and second sidewalls 442 of the trench insulation field plates 440 opposite to the channel region 120 may be aligned with each other along a second extension line 452 which is extending in the second direction when viewed from a plan view. The second extension line 452 may overlap with a sidewall of the N-type drain region 112 which is parallel with the second direction. Accordingly, a first length L4 of the planar insulation field plates 430 in a first direction corresponding to a channel length direction may be greater than a second length L5 of the trench insulation field plates 440 in the first direction.

The gate electrode 416 may cover the channel region 120, a portion of the N-type drift region 106, a portion of each planar insulation field plate 430, and a portion of each trench insulation field plate 440. The gate electrode 416 may be coupled to a gate terminal G. As illustrated in FIGS. 11 and 12, a gate insulation layer 414 may be disposed between the gate electrode 416 and the channel region 120 as well as between the gate electrode 416 and the N-type drift region 106. The gate insulation layer 414 may extend onto a portion of each trench insulation field plate 440.

A first sidewall 416-1 of the gate electrode 416 may be aligned with or may overlap with a sidewall of the N-type source region 110 contacting the channel region 120. A second sidewall 416-2 of the gate electrode 416 may be located on the planar insulation field plates 430 and the trench insulation field plates 440. Thus, an edge of the gate electrode 416 opposite to the N-type source regions 110 and adjacent to the second sidewall 416-2 may overlap with the planar insulation field plates 430 and the trench insulation field plates 440.

The gate electrode 416 may include gate extension portions 416E protruding from the second sidewall 416-2 in the first direction. The gate extension portions 416E may be spaced apart from each other in the second direction. In particular, the gate extension portions 416E may overlap with the trench insulation field plates 440 respectively, but may not overlap the planar insulation field plates 430.

As illustrated in FIG. 11, the gate electrode 416 overlapping with the planar insulation field plate 430 disposed on the first region of the N-type drift region 106 may have a first gate length LG4 in the first direction. A portion of the gate electrode 416 disposed on the planar insulation field plate 430 may serve as a conductive field plate.

As illustrated in FIG. 12, the gate electrode 416 overlapping with the trench insulation field plate 440 disposed in the first region of the N-type drift region 106 may have a second gate length LG6 corresponding to a sum of the first gate length LG4 and a length LG5 of the gate extension portions 416E in the first direction. A portion of the gate electrode 416 disposed on the trench insulation field plate 440 may serve as a conductive field plate.

As illustrated in FIG. 11, the planar insulation field plate 430 on the first region of the N-type drift region 106 may have the first sidewall 431 and the second sidewall 432 in the first direction. The first sidewall 431 of the planar insulation field plate 430 adjacent to the channel region 120 may define a first accumulation region 407-1 in the N-type drift region 106. That is, the first accumulation region 407-1 may be defined as an upper portion of the N-type drift region 106 between the first channel region 121 and the first sidewall 431.

Similarly, as illustrated in FIG. 12, the trench insulation field plate 440 in the second region of the N-type drift region 106 may have the first sidewall 441 and the second sidewall 442 in the first direction. The first sidewall 441 of the planar insulation field plate 440 adjacent to the channel region 120 may define a second accumulation region 407-2 in the N-type drift region 106. That is, the second accumulation region 407-2 may be defined as an upper portion of the N-type drift region 106 between the first channel region 121 and the first sidewall 441.

Since the second length L5 corresponding to a length of the trench insulation field plate 440 is less than the first length L4 corresponding to a length of the planar insulation field plate 430, a length of the second accumulation region 407-2 in the first direction may be greater than a length of the first accumulation region 407-1 in the first direction. While carriers in the first region of the N-type drift region 106 may be drifted along a top surface of the N-type drift region 106 under the planar insulation field plates 430, carriers in the second region of the N-type drift region 106 may be drifted along the sidewalls 441 and 442 and bottom surfaces of the trench insulation field plates 440. Thus, an on-resistance value in the second region of the N-type drift region 106 may increase as compared with an on-resistance value in the first region of the N-type drift region 106.

However, the increase of the on-resistance value in the second region of the N-type drift region 106 may be compensated for by a reduction of the on-resistance value in the first region of the N-type drift region 106. Furthermore, the increase of the on-resistance value in the second region due to the presence of the trench insulation field plates 440 may be additionally compensated for by the lengthened second accumulation region 407-2 since a length of the second accumulation region 407-2 in the first direction is relatively longer than a length of the first accumulation region 407-1 in the first direction.

Figure 13:
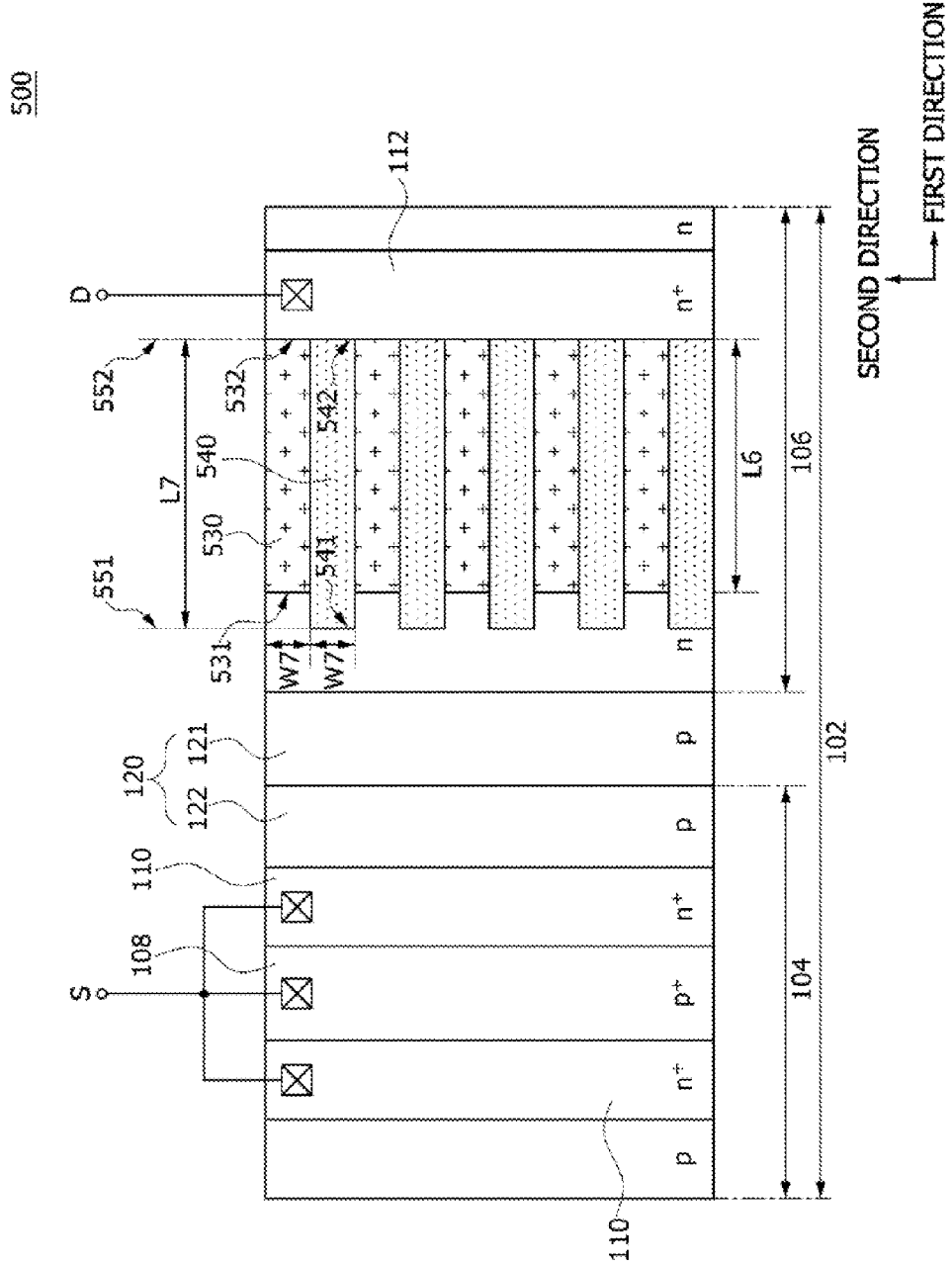
FIG. 13 is a layout diagram illustrating a lateral power integrated device without a gate electrode according to yet still another embodiment.
Figure 14:
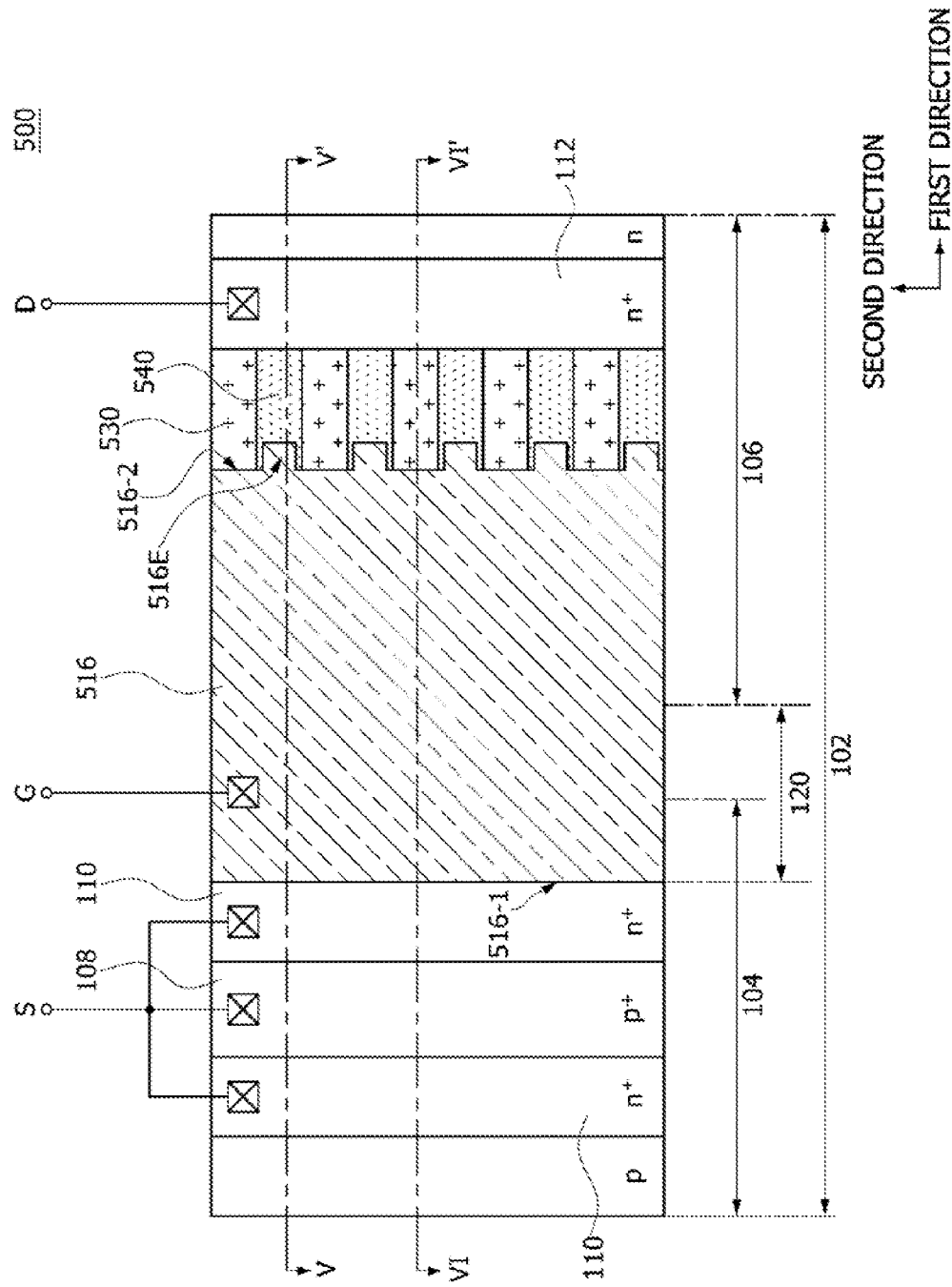
FIG. 14 is a layout diagram illustrating a lateral power integrated device with a gate electrode according to yet still another embodiment.
Figure 15:
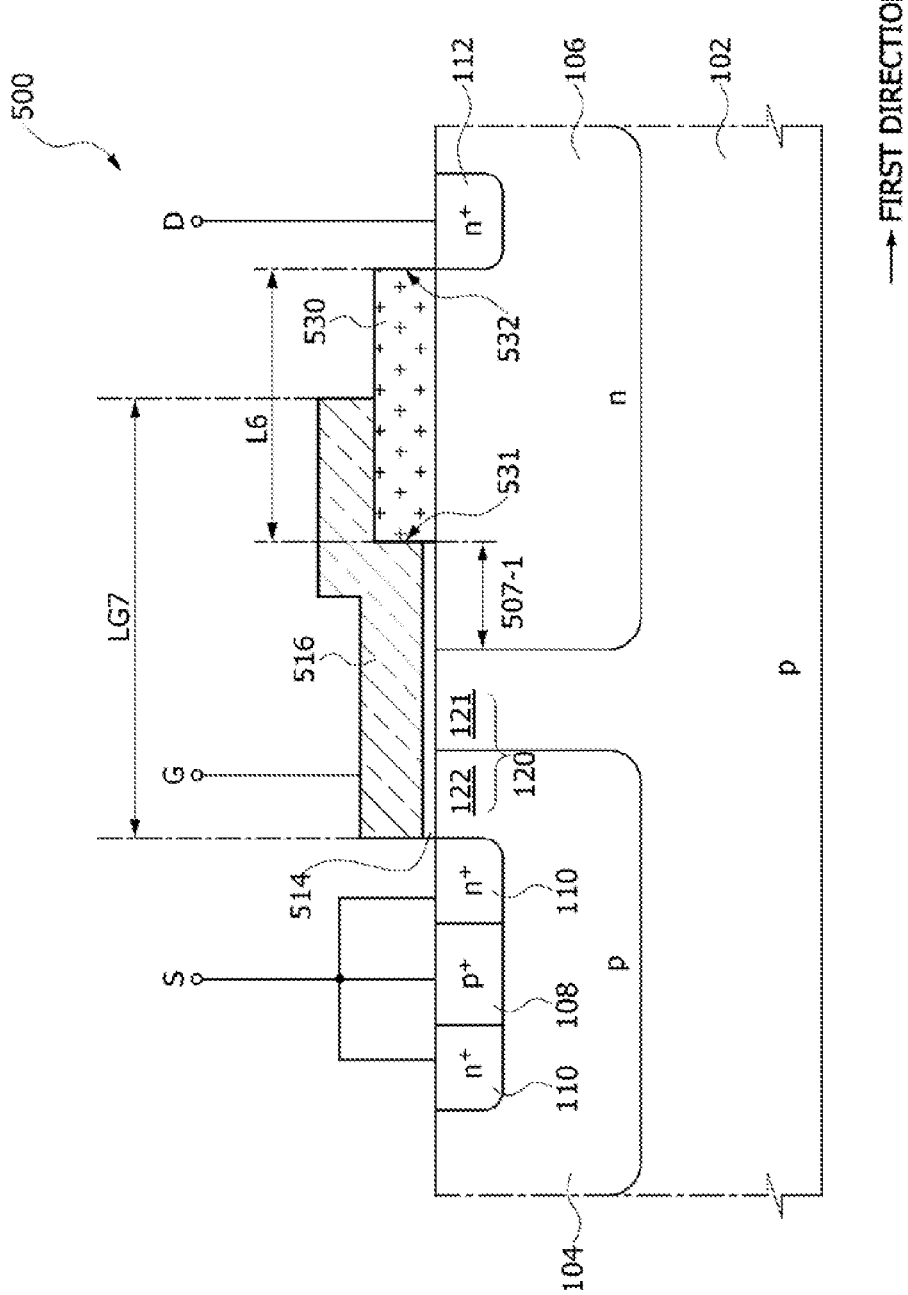
FIG. 15 is a cross-sectional view taken along the line V-V' of FIG. 14.
Figure 16:
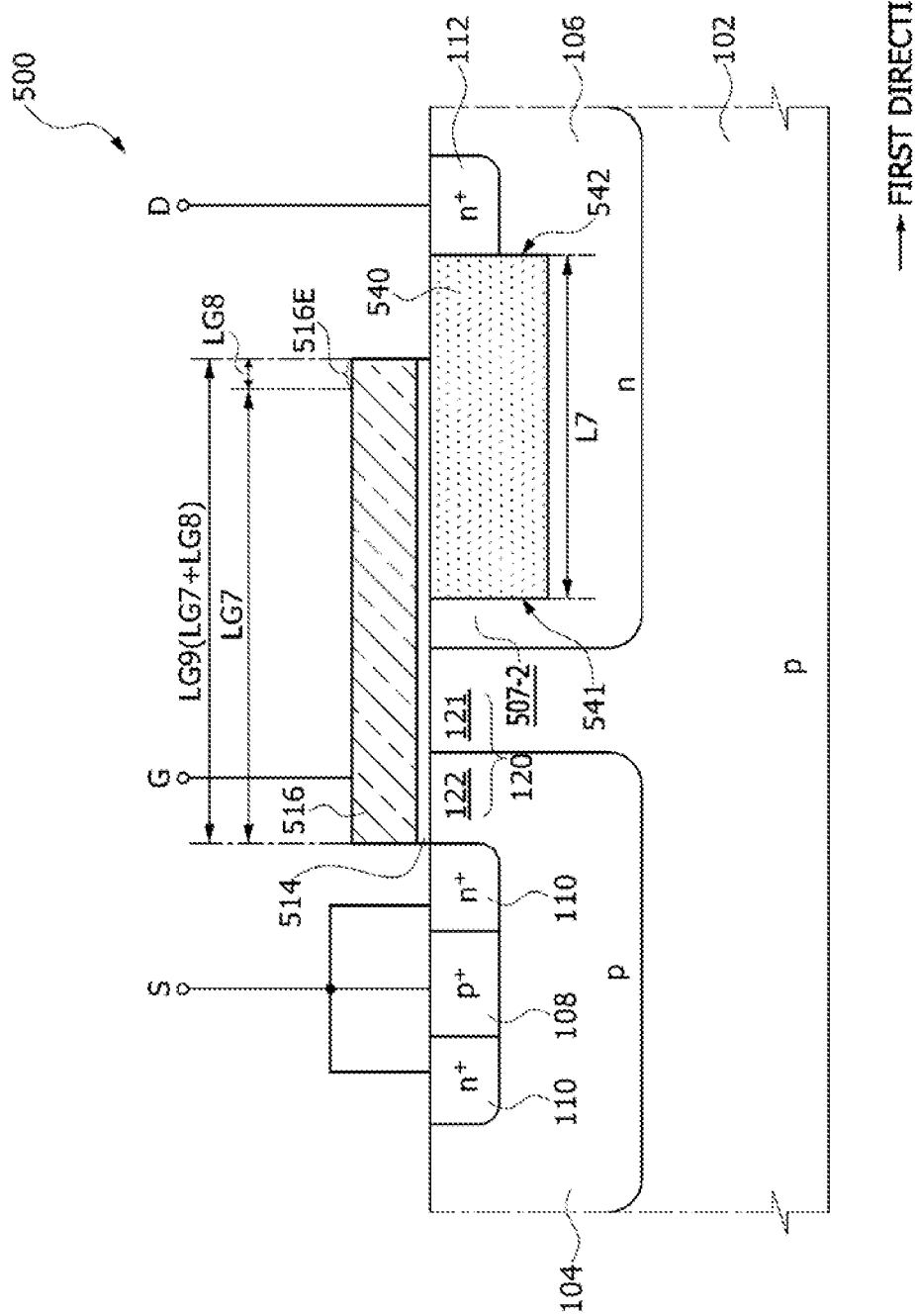
FIG. 16 is a cross-sectional view taken along the line VI-VI' of FIG. 14.

FIG. 13 is a layout diagram illustrating a lateral power integrated device 500 without a gate electrode 516 according to yet another embodiment. FIG. 14 is a layout diagram illustrating the lateral power integrated device 500 with the gate electrode 516. In addition, FIG. 15 is a cross-sectional view taken along the line V-V' of FIG. 14, and FIG. 16 is a cross-sectional view taken along the line VI-VI' of FIG. 14. In FIGS. 13 to 16, the same reference numerals as used in FIGS. 1 to 4 denote the same elements. Thus, descriptions of the same elements as set forth with reference to FIGS. 1 to 4 will be omitted or briefly mentioned hereinafter to avoid duplicate description.

Referring to FIGS. 13 to 16, a portion of the N-type drift region 106 adjacent to the N-type drain region 112 may be divided into a first region in which a plurality of planar insulation field plates 530 are disposed and a second region in which a plurality of trench insulation field plates 540 are disposed. The planar insulation field plates 530 and the trench insulation field plates 540 may be alternately arrayed in a second direction corresponding to a channel width direction in a plan view. The planar insulation field plates 530 may be disposed on the N-type drift region 106 between the N-type drain region 112 and the first channel region 121. The trench insulation field plates 540 may be disposed in the N-type drift region 106 between the N-type drain region 112 and the first channel region 121. The planar insulation field plates 530 and the trench insulation field plates 540 may have substantially the same width W7 when measured in the second direction.

First sidewalls 541 of the trench insulation field plates 540 opposite to the N-type drain region 112 may extend to a first extension line 551 extending in the second direction. First sidewalls 531 of the planar insulation field plates 530 opposite to the N-type drain region 112 may extend to a point shorter than the first extension line 551 along the first direction.

Second sidewalls 532 of the planar insulation field plates 530 opposite to the channel region 120 and second sidewalls 542 of the trench insulation field plates 540 opposite to the channel region 120 may be aligned with each other along a second extension line 552 which is extending in the second direction when viewed from a plan view. The second extension line 552 may overlap with a sidewall of the N-type drain region 112 which is parallel with the second direction. Accordingly, a first length L6 of the planar insulation field plates 530 in a first direction corresponding to a channel length direction may be shorter than a second length L7 of the trench insulation field plates 540 in the first direction.

The gate electrode 516 may cover the channel region 120, a portion of the N-type drift region 106, a portion of each planar insulation field plate 530, and a portion of each trench insulation field plate 540. The gate electrode 516 may be coupled to a gate terminal G. As illustrated in FIGS. 15 and 16, a gate insulation layer 514 may be disposed between the gate electrode 516 and the channel region 120 as well as between the gate electrode 516 and the N-type drift region 106. The gate insulation layer 514 may extend onto a portion of each trench insulation field plate 540.

A first sidewall 516-1 of the gate electrode 516 may be aligned with or may overlap with a sidewall of the N-type source region 110 contacting the channel region 120. A second sidewall 516-2 of the gate electrode 516 may be located on the planar insulation field plates 530 and the trench insulation field plates 540. Thus, an edge of the gate electrode 516 opposite to the N-type source regions 110 and adjacent to the second sidewall 516-2 may overlap with the planar insulation field plates 530 and the trench insulation field plates 540.

The gate electrode 516 may include gate extension portions 516E protruding from the second sidewall 516-2 in the first direction. The gate extension portions 516E may be spaced apart from each other in the second direction. In particular, the gate extension portions 516E may overlap with the trench insulation field plates 540 respectively, but may not overlap the planar insulation field plates 530.

As illustrated in FIG. 15, the gate electrode 516 overlapping with the planar insulation field plate 530 disposed on the first region of the N-type drift region 106 may have a first gate length LG7 in the first direction. A portion of the gate electrode 516 disposed on the planar insulation field plate 530 may serve as a conductive field plate. As illustrated in FIG. 16, the gate electrode 516 overlapping with the trench insulation field plate 540 disposed in the first region of the N-type drift region 106 may have a second gate length LG9 corresponding to a sum of the first gate length LG7 and a length LG8 of the gate extension portions 516E in the first direction. A portion of the gate electrode 516 disposed on the trench insulation field plate 540 may serve as a conductive field plate.

As illustrated in FIGS. 13 and 15, the planar insulation field plate 530 on the first region of the N-type drift region 106 may have the first sidewall 531 and the second sidewall 532 in the first direction. The first sidewall 531 of the planar insulation field plate 530 adjacent to the channel region 120 may define a first accumulation region 507-1 in the N-type drift region 106. That is, the first accumulation region 507-1 may be defined as an upper portion of the N-type drift region 106 between the first channel region 121 and the first sidewall 531.

Similarly, as illustrated in FIG. 16, the trench insulation field plate 540 in the second region of the N-type drift region 106 may have the first sidewall 541 and the second sidewall 542 in the first direction. The first sidewall 541 of the planar insulation field plate 540 adjacent to the channel region 120 may define a second accumulation region 507-2 in the N-type drift region 106. That is, the second accumulation region 507-2 may be defined as an upper portion of the N-type drift region 106 between the first channel region 121 and the first sidewall 541.

Since the first length L6 corresponding to a length of the planar insulation field plates 530 is less than the second length L7 corresponding to a length of the trench insulation field plates 540, a length of the first accumulation region 507-1 in the first direction may be greater than a length of the second accumulation region 507-2 in the first direction. While carriers in the first region of the N-type drift region 106 may be drifted along a top surface of the N-type drift region 106 under the planar insulation field plates 530, carriers in the second region of the N-type drift region 106 may be drifted along the sidewalls 541 and 542 and bottom surfaces of the trench insulation field plates 540.

Thus, an on-resistance value in the second region of the N-type drift region 106 increases as compared with an on-resistance value in the first region of the N-type drift region 106. However, the increase of the on-resistance value in the second region of the N-type drift region 106 may be compensated for by a reduction of the on-resistance value in the first region of the N-type drift region 106. Furthermore, the increase of the on-resistance value due to the presence of the trench insulation field plate 540 may be additionally compensated for by more increasing the length of the first accumulation region 507-1.

Figure 17:
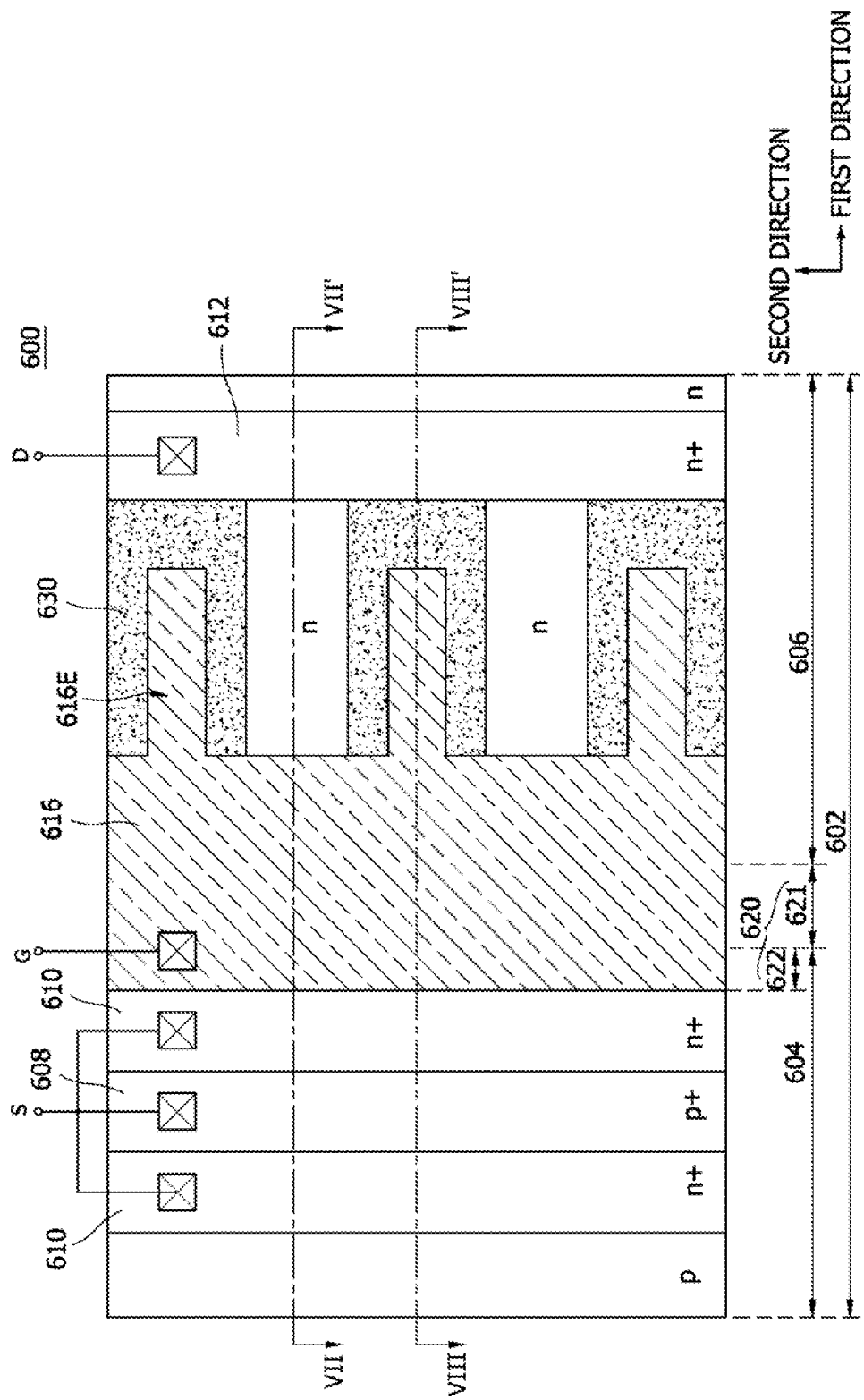
FIG. 17 is a layout diagram illustrating a lateral power integrated device according to another embodiment.
Figure 18:
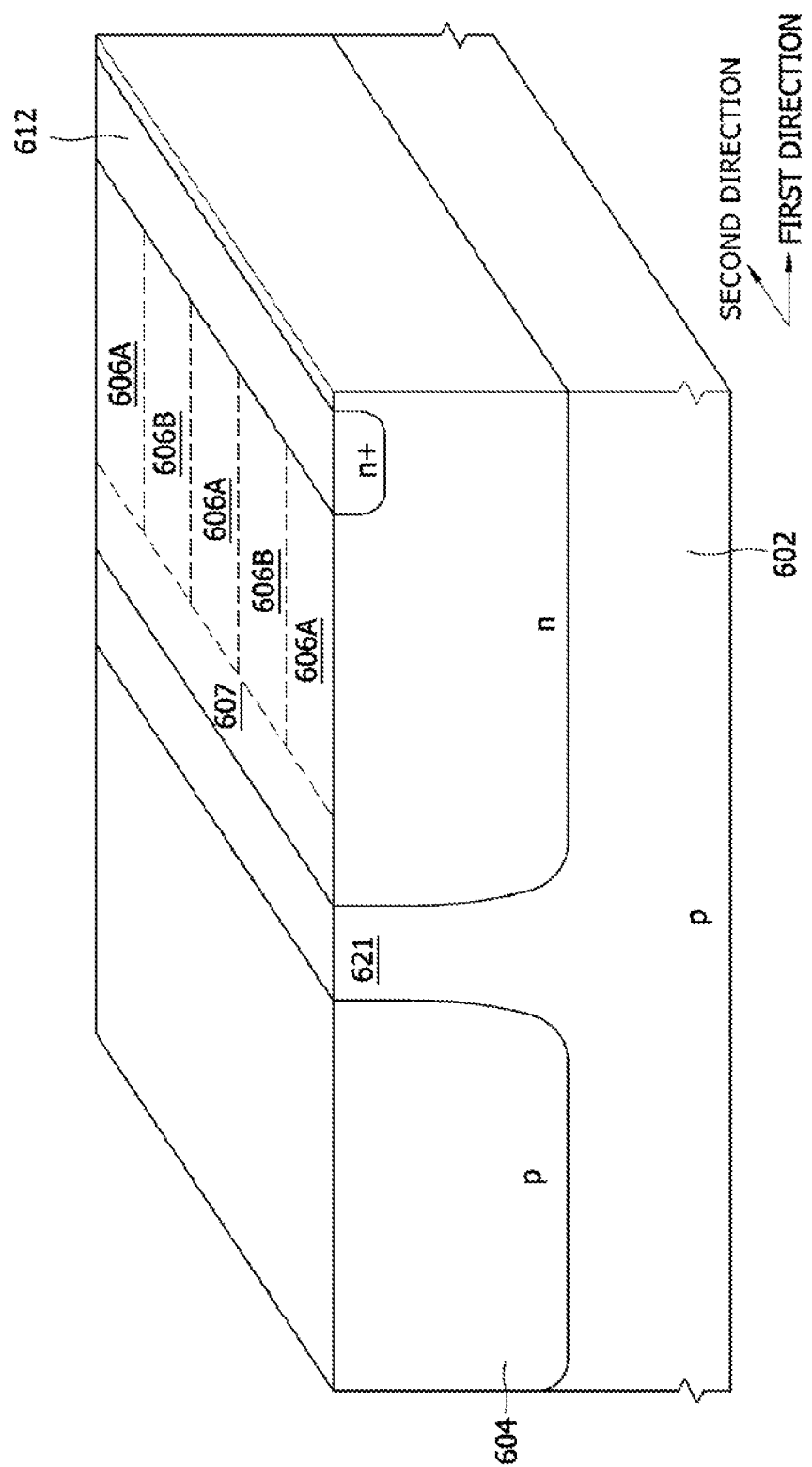
FIG. 18 illustrates a three-dimensional structure of an N-type drift region of the lateral power integrated device shown in FIG. 17.

FIG. 17 is a layout diagram illustrating a lateral power integrated device 600 according to another embodiment, and FIG. 18 illustrates a three-dimensional structure of an N-type drift region of the lateral power integrated device 600 shown in FIG. 17. Referring to FIGS. 17 and 18, a P-type body region 604 and an N-type drift region 606 may be disposed in a P-type semiconductor layer 602 and spaced apart from each other in a first direction.

In the present embodiment, the first direction may correspond to a channel length direction, that is, a direction along which carriers move or current flows due to an electric field between a drain region and a source region. The P-type body region 604 and the N-type drift region 606 may be surrounded by the P-type semiconductor layer 602. The P-type semiconductor layer 602 between the P-type body region 604 and the N-type drift region 606 may correspond to a first channel region 621.

A P-type body contact region 608 may be disposed in the P-type body region 604. The P-type body contact region 608 may extend in a second direction intersecting the first direction and have a stripe shape.

A couple of N-type source regions 610 may be disposed at both sides of the P-type body contact region 608, respectively. The couple of N-type source regions 610 may be disposed to directly contact both sidewalls of the P-type body contact region 608, respectively. The P-type body contact region 608 and the N-type source regions 610 may be coupled to a source terminal S in common.

An upper portion of the P-type body region 604 between the first channel region 621 and the N-type source regions 610 may correspond to a second channel region 622. The first and second channel regions 621 and 622 may constitute a channel region 620 of the lateral power integrated device 600. An N-type drain region 612 may be disposed in an edge of the N-type drift region 606 opposite to the channel region 620. The N-type drain region 612 may extend in the second direction and have a stripe shape.

As illustrated in FIG. 18, an upper portion of the N-type drift region 606 may be divided into first N-type drift regions 606A, second N-type drift regions 606B and an accumulation layer 607. Specifically, the accumulation layer 607 may be defined as a region that is adjacent to the first channel region 621 and overlaps with a gate electrode 616. The accumulation layer 607 may extend in the second direction in a stripe shape. The first N-type drift regions 606A and the second N-type drift regions 606B may be disposed between the accumulation layer 607 and the N-type drain region 612 and may be alternately arrayed in the second direction. A length of the first N-type drift regions 606A in the first direction may be substantially equal to a length of the second N-type drift regions 606B in the first direction. A width of each of the first N-type drift regions 606A in the second direction may be substantially equal to a width of each of the second N-type drift regions 606B in the second direction. In another embodiment, the width of each of the first N-type drift regions 606A in the second direction may be different from the width of each of the second N-type drift regions 606B in the second direction.

A plurality of planar insulation field plates 630 may be disposed on the first N-type drift regions 606A, respectively. Sidewalls of the planar insulation field plates 630 opposite to the accumulation layer 607 may be aligned with a sidewall of the N-type drain region 612. Top surfaces of the second N-type drift regions 606B may be exposed by spaces between the planar insulation field plates 630. Although not shown in the drawings, a silicidation blocking layer may be disposed on the second N-type drift regions 606B in the event that a silicidation process is used to fabricate the lateral power integrated device 600.

The gate electrode 616 may be disposed to cover the channel region 620 and a portion of the N-type drift region 606 that is, the accumulation region 607. Although not shown in FIGS. 17 and 18, a gate insulation layer may be disposed between the gate electrode 616 and the channel region 620 as well as between the gate electrode 616 and the N-type drift region 606.

A first sidewall of the gate electrode 616 opposite to the N-type drain region 612 may be aligned with or may overlap with a sidewall of the N-type source region 610 contacting the channel region 620. A second sidewall of the gate electrode 616 opposite to the N-type source region 610 may be aligned with a boundary region between the accumulation layer 607 and the first and second N-type drift regions 606A and 606B.

The gate electrode 616 may include a plurality of gate extension portions 616E protruding from the second sidewall of the gate electrode 616 in the first direction. The gate extension portions 616E may be spaced apart from each other in the second direction. In particular, the gate extension portions 616E may overlap with the planar insulation field plates 630 respectively, but may not overlap the second N-type drift regions 606B.

Figure 19:
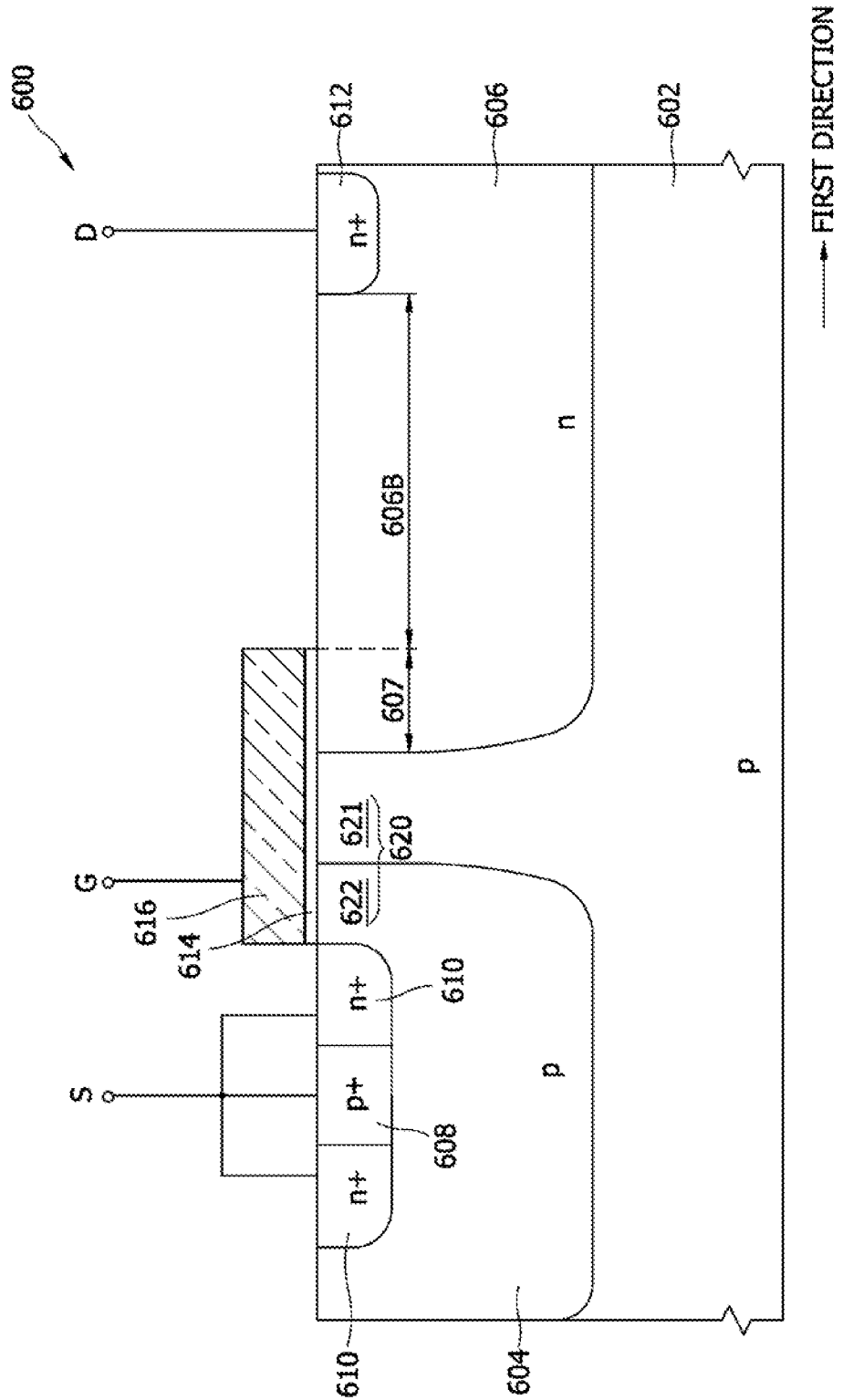
FIG. 19 is a cross-sectional view taken along the line VII-VII' of FIG. 17.
Figure 20:
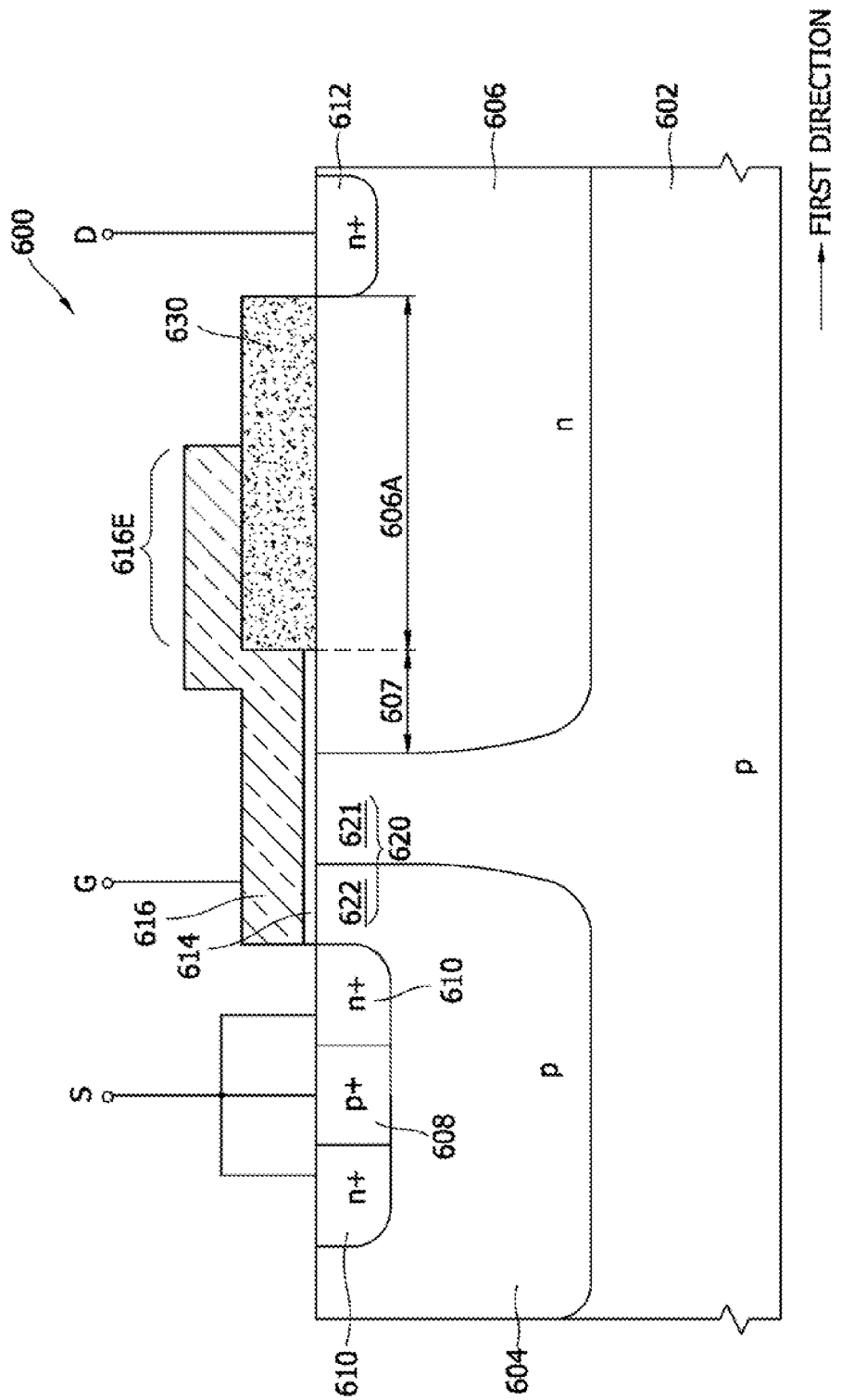
FIG. 20 is a cross-sectional view taken along the line VIII-VIII' of FIG. 17.

FIG. 19 is a cross-sectional view taken along the line VII-VII' of FIG. 17, and FIG. 20 is a cross-sectional view taken along the line VIII-VIII' of FIG. 17. In FIGS. 19 and 20, the same reference numerals as used in FIGS. 17 and 18 denote the same elements. Referring to FIGS. 19 and 20, the P-type body region 604 and the N-type drift region 606 may be disposed in an upper portion of the P-type semiconductor layer 602 spaced apart from each other in the first direction.

In some embodiments, the P-type semiconductor layer 602 may be a P-type semiconductor substrate. In some other embodiments, the P-type semiconductor layer 602 may be a P-type well region such as a P-type junction region formed in an upper portion of a semiconductor substrate. Alternatively, the P-type semiconductor layer 602 may be a P-type epitaxial layer grown on a semiconductor substrate. An upper portion of the P-type semiconductor layer 602 between the P-type body region 604 and the N-type drift region 606 may be defined as the first channel region 621.

The P-type body contact region 608 may be disposed in an upper portion of the P-type body region 604. The couple of N-type source regions 610 may be disposed in an upper portion of the P-type body region 604 and may be located at both sides of the P-type body contact region 608, respectively. A sidewall of each N-type source region 610 and a sidewall of the P-type body contact region 608 may be in direct contact with each other to provide a metallurgical junction. The P-type body contact region 608 and the N-type source regions 610 may be coupled to the source terminal S in common. An upper portion of the P-type body region 604 between the first channel region 621 and the N-type source regions 610 may be defined as the second channel region 622. The first and second channel regions 621 and 622 may constitute the channel region 620 of the lateral power integrated device 600.

The N-type drain region 612 may be disposed in an upper portion of the N-type drift region 606. The N-type drain region 612 may be coupled to a drain terminal D. Each of the planar insulation field plates 630 may be disposed on one of the first N-type drift regions 606A. Each of the planar insulation field plates 630 may have a bottom surface which is located at the same level as a top surface of the N-type drift region 606. Thus, each planar insulation field plate 630 may vertically protrude from the top surface of the N-type drift region 606 by a thickness of the planar insulation field plate 630.

A gate insulation layer 614 may be disposed on the channel region 620 and the accumulation region 607. The gate electrode 616 may be disposed on the gate insulation layer 614. The gate electrode 616 may be coupled to a gate terminal G. In some embodiments, the gate insulation layer 614 may include an oxide layer, and the gate electrode 616 may include a polysilicon layer doped with impurity ions.

The gate electrode 616 may include gate extension portions 616E extending onto the planar insulation field plates 630 disposed on the first N-type drift regions 606A. The gate extension portions 616E may be spaced apart from each other in the second direction. See FIG. 17. The gate extension portions 616E may overlap with the planar insulation field plates 630 respectively, but may not overlap the second N-type drift regions 606B.

A length of the gate extension portions 616E in the first direction may be shorter than a length of the planar insulation field plates 630 in the first direction. Thus, the gate extension portions 616E may be spaced apart from the N-type drain regions 612. The gate extension portions 616E may serve as conductive field plates.

Top surfaces of the second N-type drift regions 606B may be exposed. That is, the gate insulation layer 614 and the gate electrode 616 may vertically overlap with the channel region 620 and the accumulation region 607 since the gate extension portions 616E are not disposed on the second N-type drift regions 606B.

As described with reference to FIGS. 17 to 20, the lateral power integrated device 600 may be configured to include the first N-type drift regions 606A and the second N-type drift regions 606B which are alternately arrayed in the second direction. The planar insulation field plates 630 may be disposed on the first N-type drift regions 606A, respectively. Top surfaces of the second N-type drift regions 606B may be exposed. Thus, carriers in the N-type drift region 606 may be drifted along a top surface of the N-type drift region 606 to minimize a drift length of the carriers when the lateral power integrated device 600 is turned on. Accordingly, an on-resistance characteristic of the lateral power integrated device 600 may be improved. Furthermore, a reduction of a drain junction breakdown voltage of the lateral power integrated device 600 may be compensated for due to the presence of the planar insulation field plates 630 disposed on the first N-type drift regions 606A. In addition, the drain junction breakdown voltage of the lateral power integrated device 600 may be improved since the gate extension portions 616E serving as conductive field plates are disposed on the planar insulation field plates 630.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A lateral power integrated device comprising:
    a source region and a drain region disposed in a semiconductor layer and spaced apart from each other in a channel length direction, wherein the semiconductor layer has a first conductivity, wherein each of the source region and the drain region has a second conductivity;
    a drift region having the second conductivity, disposed in the semiconductor layer, and surrounding the drain region;
    a channel region arranged between the source region and the drift region in the channel length direction;
    a plurality of planar insulation field plates disposed over the drift region and spaced apart from each other in a channel width direction, wherein the channel width direction crosses the channel length direction;
    a plurality of trench insulation field plates disposed in the drift region, wherein the each of the trench insulation field plates is disposed between the planar insulation field plates in the channel width direction;
    a gate insulation layer formed over the channel region; and
    a gate electrode foiined over the gate insulation layer,
    wherein the first insulation plate and the second field insulation plate are alternately arranged along the channel width direction.

2. The lateral power integrated device of claim 1, further comprising:
    a body region having the first conductivity, disposed in the semiconductor layer, surrounding the source region, and spaced apart from the drift region in the channel length direction.

3. The lateral power integrated device of claim 2,
    wherein the channel region includes first and second channel regions,
    wherein the first channel region is provided between the body region and the drift region, and
    wherein the second channel region is provided in the body region and between the first channel region and the source region.

4. The lateral power integrated device of claim 1,
    wherein each of the source region, the drain region, and the drift region extends in the channel width direction in a stripe shape.

5. The lateral power integrated device of claim 1,
    wherein each of the planar insulation field plates has a bottom surface which is located substantially at the same level as a top surface of the drift region.

6. The lateral power integrated device of claim 5,
    wherein each of the trench insulation field plates has a top surface which is located substantially at the same level as the top surface of the drift region.

7. The lateral power integrated device of claim 6, further comprising:
    an accumulation region provided in the drift region and disposed between the channel region and the planar insulation field plates and the trench insulation field plates.

8. The lateral power integrated device of claim 7,
    wherein each of the gate insulation layer and the gate electrode further extends over the accumulation region in the channel length direction.

9. The lateral power integrated device of claim 8,
wherein the gate insulation layer further extends over the trench insulation field plates in the channel length direction; and
wherein the gate electrode further extends over the planar insulation field plates and the trench insulation field plates in the channel length direction.

10. The lateral power integrated device of claim 9, further comprising:
a plurality of gate extensions extending from the gate electrode to over the trench insulation field plates.

11. The lateral power integrated device of claim 10,
wherein the second gate extensions are spaced apart from each other in the channel width direction.

12. The lateral power integrated device of claim 10,
wherein the gate extensions do not overlap the planar insulation field plates.

13. The lateral power integrated device of claim 1,
wherein a width of each of the planar insulation field plates measured in the channel width direction is substantially equal to a width of each of the trench insulation field plates measured in the channel width direction.

14. The lateral power integrated device of claim 1,
wherein a width of each of the planar insulation field plates measured in the channel width direction is shorter than a width of each of the trench insulation field plates measured in the channel width direction.

15. The lateral power integrated device of claim 1,
wherein a width of each of the planar insulation field plates measured in the channel width direction is greater than a width of each of the trench insulation field plates measured in the channel width direction.

16. The lateral power integrated device of claim 1,
wherein each of sidewalls of the planar insulation field plates and sidewalls of the trench insulation field plates is aligned with a sidewall of the drain region.

17. The lateral power integrated device of claim 16,
wherein a length of each of the planar insulation field plates measured in the channel length direction is substantially equal to a length of each of the trench insulation field plates measured in the channel length direction.

18. The lateral power integrated device of claim 16,
wherein a length of each of the planar insulation field plates measured in the first direction is greater than a length of each of the trench insulation field plates measured in the channel length direction.

19. The lateral power integrated device of claim 16,
wherein a length of each of the planar insulation field plates measured in the channel length direction is shorter than a length of each of the trench insulation field plates measured in the channel length direction.

* * * * *